(12) United States Patent
Lee et al.

(10) Patent No.: US 11,523,506 B2
(45) Date of Patent: Dec. 6, 2022

(54) MODULE BOARD AND MEMORY MODULE INCLUDING THE SAME

(71) Applicant: SAMSUNG ELECTRONICS CO., LTD., Suwon-si (KR)

(72) Inventors: Jaekwang Lee, Hwaseong-si (KR); Dongmin Jang, Hwaseong-si (KR); Hwanwook Park, Seoul (KR); Jaeseok Jang, Hwaseong-si (KR); Dohyung Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 11 days.

(21) Appl. No.: 17/345,815

(22) Filed: Jun. 11, 2021

(65) Prior Publication Data

US 2022/0141955 A1 May 5, 2022

(30) Foreign Application Priority Data

Nov. 2, 2020 (KR) .................... 10-2020-0144385

(51) Int. Cl.
*H05K 1/14* (2006.01)
*H05K 1/11* (2006.01)

(52) U.S. Cl.
CPC ... *H05K 1/117* (2013.01); *H05K 2201/10159* (2013.01)

(58) Field of Classification Search
CPC ............... H05K 1/117; H05K 2201/10159
USPC ........................................... 361/736
See application file for complete search history.

(56) References Cited

U.S. PATENT DOCUMENTS

| | | | |
|---|---|---|---|
| 8,018,753 B2 | 9/2011 | Carr et al. | |
| 8,323,037 B2 | 12/2012 | Cha et al. | |
| 8,951,048 B2 | 2/2015 | Seok et al. | |
| 9,313,891 B2 | 4/2016 | Jung et al. | |
| 9,722,335 B2 | 8/2017 | Berry, Jr. et al. | |
| 9,894,792 B2 | 2/2018 | Bae et al. | |
| 2009/0246611 A1* | 10/2009 | Kim ............... | H05K 1/117 174/260 |
| 2014/0003003 A1* | 1/2014 | Sawada ............ | H04M 1/185 361/679.01 |

FOREIGN PATENT DOCUMENTS

| | | |
|---|---|---|
| KR | 1998-045518 U | 9/1998 |
| KR | 2002-0090047 A | 11/2002 |
| KR | 10-0660878 B1 | 12/2006 |
| KR | 10-2007-0057335 A | 6/2007 |

* cited by examiner

*Primary Examiner* — Andargie M Aychillhum
(74) *Attorney, Agent, or Firm* — Sughrue Mion, PLLC

(57) ABSTRACT

A module board is provided. The module board includes a plurality of first left terminals and a plurality of first right terminals. Each of the plurality of first left terminals includes a left upper body, a left lower body, and a left lower bar which are connected to one another and sequentially provided, each of the plurality of first right terminals includes a right upper body, a right lower body, and a right lower bar which are connected to one another and sequentially provided, and a first width of each of the left upper body and the right upper body is greater than a second width of each of the left lower bar and the right lower bar.

19 Claims, 19 Drawing Sheets

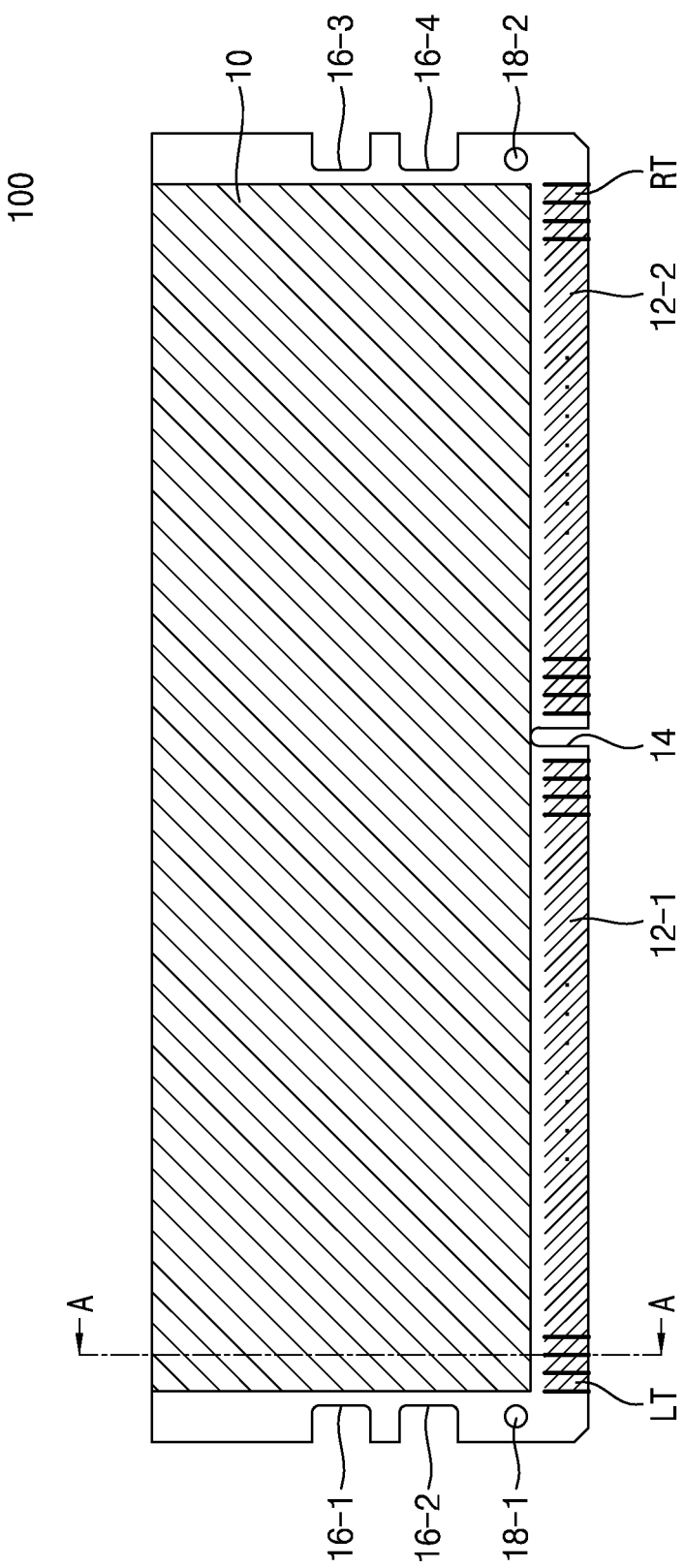

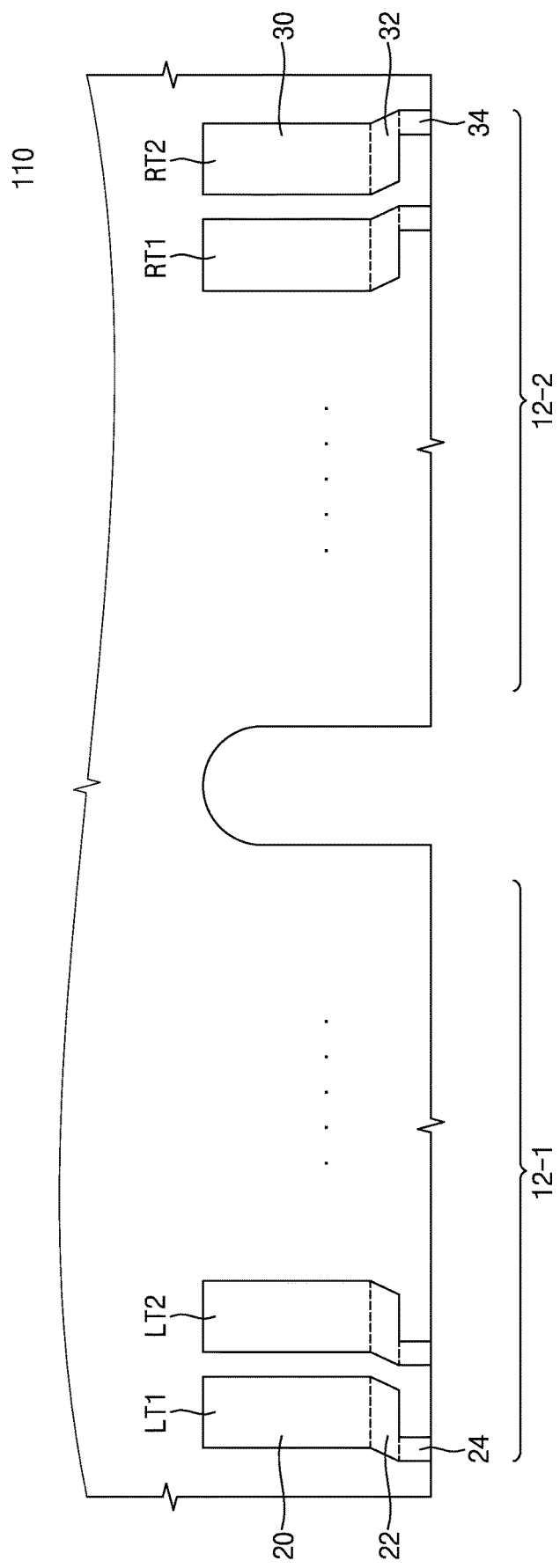

MODULE BOARD AND MEMORY MODULE INCLUDING THE SAME

CROSS-REFERENCE TO THE RELATED APPLICATION

This application claims priority from Korean Patent Application No. 10-2020-0144385, filed on Nov. 2, 2020 in the Korean Intellectual Property Office, the disclosure of which is incorporated herein by reference in its entirety.

BACKGROUND

1. Field

Methods, apparatuses and systems consistent with example embodiments relate to a module board and a memory module including the same.

2. Description of Related Art

Module boards include single-sided module boards and double-sided module boards. Single-sided module boards may include an element region where elements are mounted on one surface of a module board and a terminal region where terminals (for example, taps) are disposed, whereas double-sided module boards may include element regions where elements are mounted on both surfaces of a module board and terminal regions where terminals are disposed.

A module board may be inserted into a slot (or a socket) mounted on a main board (or a system board). The slot may include a plurality of connection terminals (for example, a plurality of pins) corresponding to terminals of the module board. When the module board is inserted into the slot, the terminals of the module board may be connected to the connection terminals of the slot. However, when the module board is diagonally inserted into the slot instead of a normal direction (a vertical direction), an electrical defect may occur due to a mismatch (for example, a contact between adjacent terminals which do not correspond to each other) between the terminals of the module board and the connection terminals of the slot, one or more terminal of the module board or connection terminals may be scratched, and lower bars of the terminals may be broken due to a concentrated load of each of the terminals (particularly, terminals disposed at a leftmost portion or a rightmost portion).

SUMMARY

One or more example embodiments provide a module board and a memory module including the same, which prevent defects of terminals from occurring when the module board is being inserted into a slot.

Example embodiments may address at least the above problems and/or disadvantages and other disadvantages not described above. Also, the example embodiments are not required to overcome the disadvantages described above, and may not overcome any of the problems described above.

According to an aspect of an example embodiment, a module board includes a plurality of first left terminals disposed in a left terminal region located at a left portion of an edge region provided on a first surface of the module board; and a plurality of first right terminals disposed in a right terminal region located at a right portion of the edge region. Each of the plurality of first left terminals includes a left upper body, a left lower body, and a left lower bar which are connected to one another and sequentially provided between a left upper portion of the left terminal region and a left lower portion of the left terminal region. Each of the plurality of first right terminals includes a right upper body, a right lower body, and a right lower bar which are connected to one another and sequentially provided between a right upper portion of the right terminal region and a right lower portion of the right terminal region. A first width of each of the left upper body and the right upper body is greater than a second width of each of the left lower bar and the right lower bar.

According to an aspect of an example embodiment, a memory module includes: a module board having an edge region provided on a first surface of the module board, the module board including a plurality of left terminals disposed in a left terminal region of the edge region and a plurality of right terminals disposed in a right terminal region of the edge region; and a plurality of semiconductor memory devices provided on the first surface of the module board, the plurality of left terminals being configured to transfer left signals and left powers to the plurality of semiconductor memory devices, and the plurality of right terminals being configured to transfer right signals and right powers to the plurality of semiconductor memory devices. Each of the plurality of left terminals includes a left upper body, a left lower body and a left lower bar which are connected to one another and sequentially provided between an upper portion of the left terminal region and a lower portion of the left terminal region, the left upper body has a first height and a first width, the left lower body has a second height, a second minimum width and a second maximum width, a portion of a left surface of the left lower body and a portion of a right surface of the left lower body extend diagonally toward a left direction, the left lower bar has a third height, a third minimum width and a third maximum width, and a right surface of the left lower bar extends diagonally toward the left direction. Each of the plurality of right terminals includes a right upper body, a right lower body and a right lower bar which are connected to one another and sequentially provided between an upper portion of the right terminal region and a lower portion of the right terminal region, the right upper body has the first height and the first width, the right lower body has the second height, the second minimum width and the second maximum width, a left surface and a right surface of the right lower body extend diagonally toward a right direction, the right lower bar has the third height, the third minimum width and the third maximum width, and a left surface of the right lower bar extends diagonally toward the right direction. The first height is greater than a sum of the second height and the third height, the first width is greater than the second minimum width, and the second minimum width is greater than the third minimum width and the third maximum width.

According to an aspect of an example embodiment, a memory module includes a module board having an edge region provided on a first surface of the module board, the module board including a plurality of first left terminals disposed in a left terminal region of the edge region, and a plurality of first right terminals disposed in a right terminal region of the edge region; and a plurality of semiconductor memory devices provided on the first surface of the module board, the plurality of first left terminals being configured to transfer left signals and left powers to the plurality of semiconductor memory devices, and the plurality of first right terminals being configured to transfer right signals and right powers to the plurality of semiconductor memory devices. Each of the plurality of first left terminals includes a left upper body, a left lower body, and a left lower bar which are connected to one another and sequentially provided between an upper portion of the left terminal region and a lower portion of the left terminal region, a left surface of the left lower bar being horizontally offset from a left surface of the left upper body. Each of the plurality of first right terminals includes a right upper body, a right lower body, and a right lower bar which are connected to one another and sequentially provided between an upper portion of the right terminal region and a lower portion of the right terminal region, a right surface of the right lower bar being horizontally offset from a right surface of the right upper body. A first width of each of the left upper body and the right upper body is greater than a second width of each of the left lower bar and the right lower bar.

BRIEF DESCRIPTION OF THE DRAWINGS

The above and other aspects will be more apparent from the following description of example embodiments taken in conjunction with the accompanying drawings, in which:

FIGS. 1A, 1B and 1C are diagrams illustrating module boards according to an example embodiments;

FIG. 2 is a schematic diagram illustrating an arrangement of left terminals disposed in a left terminal region of a module board and right terminals disposed in a right terminal region of the module board, according to an example embodiment;

DETAILED DESCRIPTION

Hereinafter, example embodiments will be described with reference to the accompanying drawings.

FIG. 1A is a diagram illustrating a module board according to an example embodiment. The module board 100 may include an element region 10 where a plurality of elements are disposed. The plurality of elements may be disposed on one surface (for example, a top surface) of the module board 100. The module board 100 may include a left terminal region 12-1 which is disposed at a left portion of an edge region of one side of the one surface, a plurality of left terminals LT (for example, left taps) which are arranged in one row (in a stripe type) in the left terminal region 12-1, a right terminal region 12-2 which is disposed at a right portion of the edge region of the one side of the one surface, and a plurality of right terminals RT (for example, right taps) which are arranged in one row in the right terminal region 12-2. Also, the module board 100 may include a plurality of notches 14 and 16-1 to 16-4 and a plurality of holes 18-1 and 18-2, which are reference points corresponding to positions of the module board 100. The notch 14 may be disposed between the left terminal region 12-1 and the right terminal region 12-2, which are disposed at edges of the one surface of the module board 100, and may differentiate a left portion of the module board 100 from a right portion of the module board 100. According to other example embodiments, the plurality of elements may be disposed on two surfaces (for example, the top surface and a bottom surface) of the module board 100. An element region, a left terminal region, and a right terminal region may be disposed on another surface (for example, the bottom surface) of the module board 100 at positions of the other surface corresponding to the element region 10, the left terminal region 12-1, and the right terminal region 12-2 which are disposed on the one surface of the module board 100.

Figure 1B:
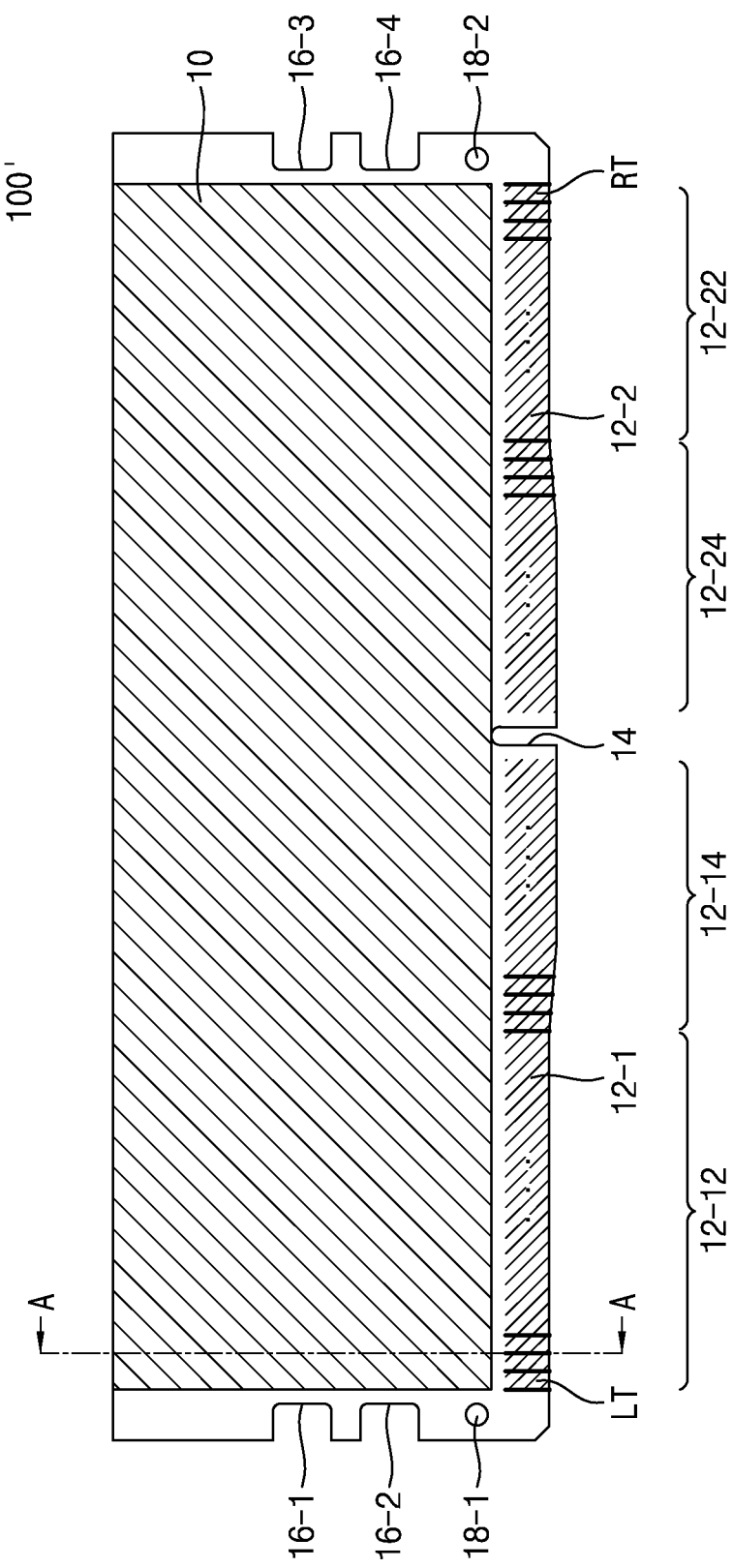

FIG. 1B is a diagram illustrating a module board 100' according to an example embodiment. A left terminal region 12-1 of the module board 100' illustrated in FIG. 1B may be divided into a first left terminal region 12-12 and a second left terminal region 12-14, and a right terminal region 12-2 of the module board 100' may be divided into a first right terminal region 12-22 and a second right terminal region 12-24. For example the first left terminal region 12-12, the second left terminal region 12-14, the first right terminal region 12-22 and the second right terminal region 12-24 may have the same width. However, example embodiments are not limited thereto, and the first left terminal region 12-12 may be wider or narrower than the second left terminal region 12-14, and the first right terminal region 12-22 may be wider or narrower than the second right terminal region 12-24.

A height of each of a plurality of left terminals LT disposed in the second left terminal region 12-14 of the module board 100' illustrated in FIG. 1B may be greater than that of each of a plurality of left terminals LT disposed in the first left terminal region 12-12. Likewise, a height of each of a plurality of right terminals RT disposed in the second right terminal region 12-24 may be greater than that of each of a plurality of right terminals RT disposed in the first right terminal region 12-22. As illustrated in FIG. 1B, upper surfaces of a plurality of left terminals LT disposed in the left terminal region 12-1 and upper surfaces of a plurality of right terminals RT disposed in the right terminal region 12-2 may be disposed on the same line.

Figure 1C:
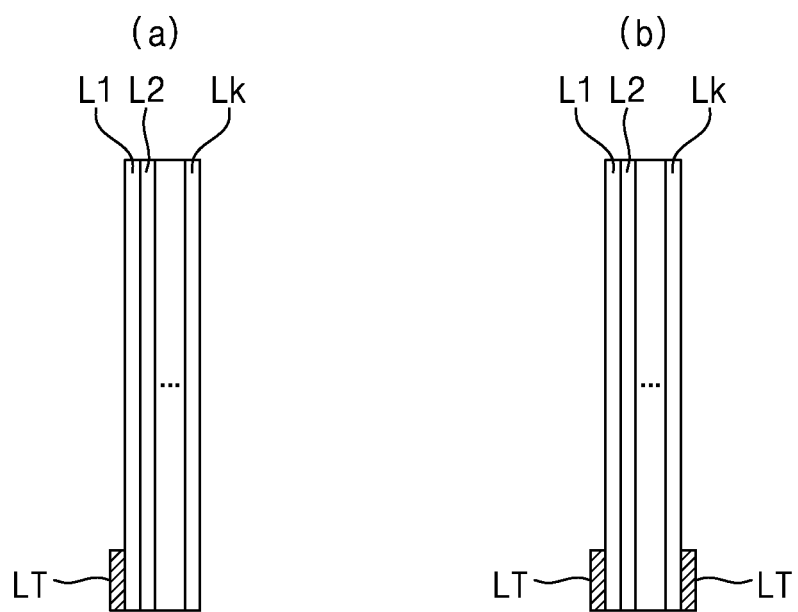

FIG. 1C illustrates diagrams of cross-sectional views of module boards according to example embodiments and illustrate a cross-sectional view taken along line A-A of FIG. 1A and along line A-A of FIG. 1B. Portion (a) of FIG. 1C is a cross-sectional view of a case where a plurality of left and right terminals are disposed on one surface of the module board 100 or the module board 100', and FIG. 1C (b) is a cross-sectional view of a case where a plurality of left and right terminals are disposed on both surfaces of the module board 100 or the module board 100'.

Referring to FIGS. 1A, 1B and 1C, the module board 100 or the module board 100' may be a printed circuit board configured with a plurality of layers (for example, k (where k is an integer of 2 or more) number of layers L1 to Lk) which are stacked. A plurality of signal lines and/or a plurality of power lines may be disposed on top surfaces and/or bottom surfaces of the k layers L1 to Lk of the module board 100 or the module board 100'. A plurality of left terminals LT and a plurality of right terminals RT may be directly/indirectly connected to the plurality of signal lines and/or the plurality of power lines and may transfer signals and/or power. The plurality of left terminals LT and the plurality of right terminals RT may be directly connected to signal lines and/or power lines of a top surface of the layer L1 and/or a bottom surface of the layer Lk of the module board 100 or the module board 100', or may be indirectly connected to, through a plurality of vias, signal lines and/or power lines disposed on another layer of the module board 100 or the module board 100'.

FIG. 2 is a schematic diagram illustrating an arrangement of a plurality of left terminals disposed in a left terminal region 12-1 of a module board and a plurality of right terminals disposed in a right terminal region 12-2 of the module board, according to an example embodiment. As shown, two representative left terminals LT1 and LT2 may be disposed at a leftmost portion of the left terminal region 12-1 of a module board 110 and two representative right terminals RT1 and RT2 may be disposed at a rightmost portion of the right terminal region 12-2 of the module board 110.

Referring to FIGS. 1A, 1B, and 2, each of the plurality of left terminals LT including the left terminals LT1 and LT2 may include a left upper body 20, a left lower body 22, and a left lower bar 24 which are connected to one another and sequentially disposed from an upper portion of the left terminal region 12-1 to a lower portion of the left terminal region 12-1 (i.e., from an inner portion of the module board 110 to an end of at least one surface of the module board 110). Additionally, a left surface of the left lower bar 24 may be offset from a left surface of the left upper body 20. For example, the left surface of the left lower bar 24 may be disposed farther left than a left surface of the left upper body 20. For example, a left surface of the left lower bar 24 of the left terminal LT2 may be disposed between a left surface of the left upper body 20 of the left terminal LT2 and a right surface of the left upper body 20 of the left lower bar 24 of the left terminal LT1. The left upper body 20, the left lower body 22, and the left lower bar 24 may be provided as one body.

Each of the plurality of right terminals RT including the right terminals RT1 and RT2 may include a right upper body 30, a right lower body 32, and a right lower bar 34 which are connected to one another and sequentially disposed from an upper portion of the right terminal region 12-2 to a lower portion of the right terminal region 12-2 (i.e., from the inner portion of the module board 110 to an end of at least one surface of the module board 110). Additionally, a right surface of the right lower bar 34 may be offset from a right surface of the right upper body 30. For example, the right surface of the right lower bar 34 may be disposed farther to the right than a right surface of the right upper body 30. For example, a right surface of the right lower bar 34 of the right terminal RT2 may be disposed between a right surface of the right upper body 30 of the right terminal RT1 and a left surface of the right upper body 30 of the right terminal RT2. The right upper body 30, the right lower body 32, and the right lower bar 34 may be provided as one body.

Figure 3:
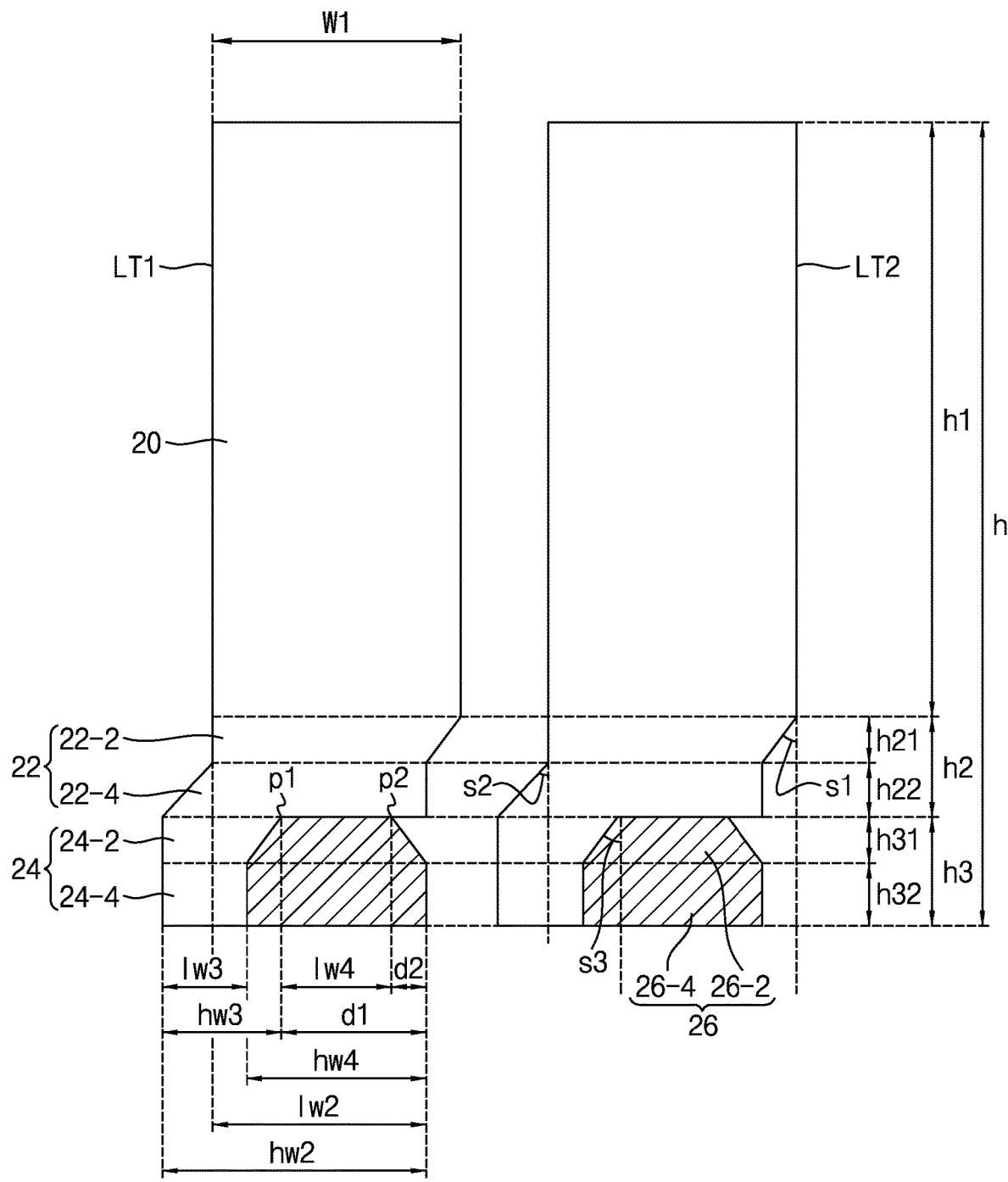
FIG. 3 is a detailed diagram illustrating left terminals according to an example embodiment.

FIG. 3 is a detailed diagram illustrating a plurality of left terminals disposed in a left terminal region 12-1 according to an example embodiment.

The detailed shapes and arrangement of two representative left terminals LT1 and LT2 disposed in the left terminal region 12-1 will be described below with reference to FIGS. 1 to 3.

The left terminals LT1 and LT2 disposed in the left terminal region 12-1 of the module board 110 may include a conductive material. Each of the left terminals LT1 and LT2 may have a height h from an end of one side of the module board 100 or the module board 100'.

The left upper body 20 may have a first certain height h1 and a first certain width w1 and may be disposed in a rectangular shape (for example, a square shape). The left lower body 22 may have a second certain height h2, a second maximum certain width hw2 and a second minimum certain width lw2, and the left lower bar 24 may have a third certain height h3, a third maximum certain width hw3 and a third minimum certain width lw3. The first certain height h1 may be greater than a sum of the second certain height h2 and the third certain height h3, and the second certain height h2 may be greater than or equal to the third certain height h3. The second maximum certain width hw2 may be greater than or equal to the first certain width w1.

The left lower body 22 may include a first left lower body 22-2 and a second left lower body 22-4, the first left lower body 22-2 may have a fourth certain height h21, the second left lower body 22-4 may have a fifth certain height h22, and the fourth certain height h21 may be less than the fifth certain height h22. A left surface of the first left lower body 22-2 may be disposed to be vertical from an end of a left surface of the left upper body 20 (i.e., aligned with the left surface of the left upper body 20), and a right surface of the first left lower body 22-2 may be disposed to have a first certain slope s1 toward the left from an end of a right surface of the left upper body 20. A left surface of the second left lower body 22-4 may be disposed to have a second certain slope s2 toward the left from an end of a left surface of the first left lower body 22-2, and a right surface of the second left lower body 22-4 may be disposed to be vertical from an end of a right surface of the first left lower body 22-2 (i.e., aligned with the right surface of the first left lower body 22-2). The first certain slope s1 may be the same as or different from the second certain slope s2.

The left lower bar 24 may include a first left lower bar 24-2 and a second left lower bar 24-4. The first left lower bar 24-2 may have a sixth certain height h31, the second left lower bar 24-4 may have a seventh certain height h32, and the sixth certain height h31 may be less than the seventh certain height h32. A left surface of the first left lower bar 24-2 may be disposed to be vertical from an end of a left surface of the second left lower body 22-4, and a right surface of the first left lower bar 24-2 may be disposed to have a third certain slope s3 toward the left from a first point p1 which is horizontally offset, by a first certain distance d1, from an end of a right surface of the second left lower body 22-4. The third certain slope s3 may be the same as or different from the second certain slope s2. A left surface of the second left lower body 24-4 may be disposed to be vertical from an end of a left surface of the first left lower bar 24-2, and a right surface of the second left lower bar 24-4 may be disposed to be vertical from an end of a right surface of the first left lower bar 24-2. The third maximum certain width hw3 and the third minimum certain width lw3 may be less than the first certain width w1.

Additionally, a left conductive inhibition region 26, where a conductive material should not be provided, may be between an end of the module board 100 or the module board 100' and a lower surface of the second left lower body 22-4 of each of the left terminals LT1 and LT2. The left conductive inhibition region 26 may include a first left conductive inhibition region 26-2 and a second left conductive inhibition region 26-4. The first left conductive inhibition region 26-2 may have a sixth certain height h31, and a fourth minimum certain width lw4 and a fourth certain width hw4, and the second left conductive inhibition region 26-4 may have the seventh certain height h32 and the fourth certain width hw4. A left surface of the first left conductive inhibition region 26-2 may be disposed to have a third certain slope s3 toward the left from the first point p1, and a right surface of the first left conductive inhibition region 26-2 may be disposed to have the third certain slope s3 toward the right from a second point p2 horizontally offset, by a second certain distance d2 which is less than the first certain distance d1, from the end of the right surface of the second left lower body 22-4. A left surface of the second left conductive inhibition region 26-4 may be disposed to be vertical from an end of a left surface of the first left conductive inhibition region 26-2, and a right surface of the second left conductive inhibition region 26-4 may be disposed to be vertical from an end of a right surface of the first left conductive inhibition region 26-2. That is, the second left conductive inhibition region 26-4 may have the seventh certain height h32 and the fourth certain width hw4 and may be disposed in a rectangular shape. A left surface of the left conductive inhibition region 26 may be disposed adjacent to a right surface of the left lower bar 24.

Figure 4:
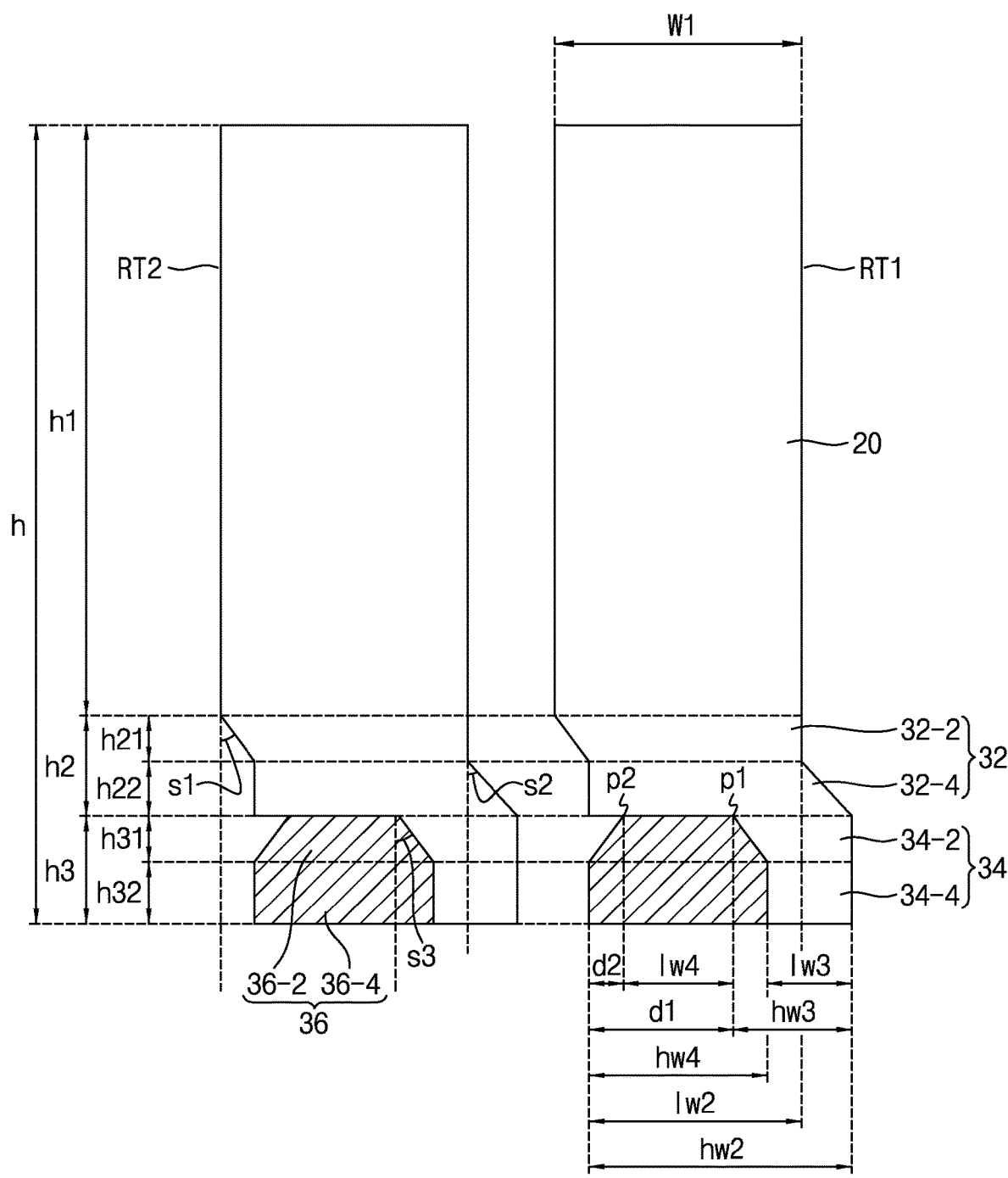
FIG. 4 is a detailed diagram illustrating right terminals according to an example embodiment.

FIG. 4 is a detailed diagram illustrating a plurality of right terminals disposed in a right terminal region 12-2 of the module board according to an example embodiment.

The detailed shapes and arrangement of two representative right terminals RT1 and RT2 disposed in a right terminal region 12-2 will be described below with reference to FIGS. 1 to 4.

The right terminals RT1 and RT2 disposed in the right terminal region 12-2 of the module board 110 may include a conductive material. Each of the right terminals RT1 and RT2 may have a height h from an end of one side of the module board 100.

The right upper body 30 may have the same shape as the left upper body 20 described above with reference to FIG. 3.

The right lower body 32 may include a first right lower body 32-2 and a second right lower body 32-4, and the first right lower body 32-2 and the second right lower body 32-4 may have the same height and width as the first left lower body 22-2 and the second left lower body 22-4 described above with reference to FIG. 3, but may have a shape which differs from that of each of the first left lower body 22-2 and the second left lower body 22-4. A right surface of the first right lower body 32-2 may be disposed to be vertical from an end of a right surface of the right upper body 30, and a left surface of the first right lower body 32-2 may be disposed to have the first certain slope s1 toward the right from an end of a left surface of the right upper body 30. A right surface of the second right lower body 32-4 may be disposed to have the second certain slope s2 toward the right from an end of a right surface of the first right lower body 32-2, and a left surface of the second right lower body 32-4 may be disposed to be vertical from an end of a left surface of the first right lower body 32-2. That is, the right lower body 32 may be formed to be symmetrical with the left lower body 22.

The right lower bar 34 may include a first right lower bar 34-2 and a second right lower bar 34-4. The first right lower bar 34-2 and the second right lower bar 34-4 may have the same height and width as the first left lower bar 24-2 and the second left lower bar 24-4 described above with reference to FIG. 3, but may have a shape which differs from that of each of the first left lower bar 24-2 and the second left lower bar 24-4. A right surface of the first right lower bar 34-2 may be disposed to be vertical from an end of a right surface of the second right lower body 32-4, and a left surface of the first right lower bar 34-2 may be disposed to have the third certain slope s3 toward the right from the first point p1 which is horizontally offset, by the first certain distance d1, from an end of a left surface of the second right lower body 32-4. A right surface of the second right lower bar 34-4 may be disposed to be vertical from an end of a right surface of the first right lower bar 34-2, and a left surface of the second right lower bar 34-4 may be disposed to be vertical from an end of a left surface of the first right lower bar 34-2. That is, the right lower bar 34 may be formed to be symmetrical with the left lower bar 24.

Additionally, a right conductive inhibition region 36 where a conductive material should not be provided may be between a lower surface and an end of the second right lower body 32-4 of each of the right terminals RT1 and RT2. The right conductive inhibition region 36 may include a first right conductive inhibition region 36-2 and a second right conductive inhibition region 36-4. The first right conductive inhibition region 36-2 may be disposed to have the same shape and size as the first left conductive inhibition region 26-2, and the second right conductive inhibition region 36-4 may be disposed to have the same shape and size as the second left conductive inhibition region 26-4. A right surface of the right conductive inhibition region 36 may be disposed adjacent to a left surface of the right lower bar 34.

As a result, the right terminals RT1 and RT2 illustrated in FIG. 4 may be formed to be symmetrical with the left terminals LT1 and LT2 illustrated in FIG. 3.

Figure 5:
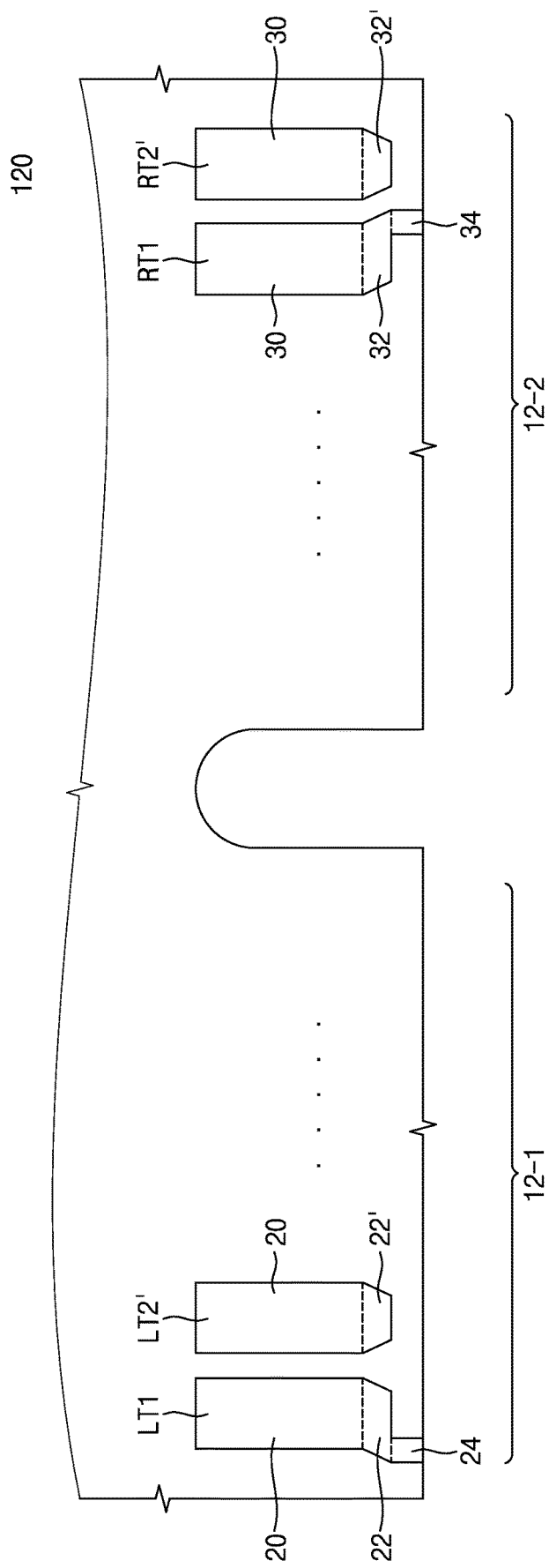
FIG. 5 is a schematic diagram illustrating an arrangement of left terminals disposed in a left terminal region of a module board and right terminals disposed in a right terminal region of the module board, according to an example embodiment.

FIG. 5 is a schematic diagram illustrating an arrangement of left terminals disposed in a left terminal region 12-1 of a module board and right terminals disposed in a right terminal region 12-2 of a module board, according to an example embodiment. As shown, two representative left terminals LT1 and LT2' may be disposed in the left terminal region 12-1 of a module board 120 and two representative right terminals RT1' and RT2 may be disposed in the right terminal region 12-2 of the module board 120. The left terminal LT1 and the right terminal RT2 may be signal terminals for transferring signals, and the left terminal LT2' and the right terminal RT1' may be power terminals for transferring power.

In contrast to the module board 110 of FIG. 2, the module board 120 of FIG. 5 may include the left terminal LT2' instead of the left terminal LT2 and may include the right terminal RT2' instead of the right terminal RT2. Other components of the module board 120 of FIG. 5 may have the same shape and arrangement as the module board 100 of FIG. 2. Therefore, descriptions of the left terminal LT1 and the right terminal RT2 illustrated in FIG. 5 may be understood from the descriptions of FIG. 2, and thus, only the shapes and arrangement of the left terminal LT2' and the right terminal RT1' will be described below.

Referring to FIG. 5, the left terminal LT2' may include a left upper body 20 and a left lower body 22'. The left terminal LT2', in contrast to the left terminal LT1, may not include a lower bar 24. The left upper body 20 of the left terminal LT2' may be the same as the left upper body 20 of the left terminal LT1. A right surface of the left lower body 22' of the left terminal LT2' may be disposed to have the same shape and size as a right surface of the left lower body 22' of the left terminal LT1, and a left surface of the left lower body 22' may be disposed to be inclined to the right from an end of a left surface of the left upper body 20, or may be disposed to be vertical thereto. The right terminal RT2' may include a right upper body 30 and a right lower body 32'. The right terminal RT2', in contrast to the right terminal RT1, may not include a lower bar 34. A left surface of the right lower body 32' of the right terminal RT2' may be disposed to have the same shape and size as a left surface of the right lower body 32 of the right terminal RT1, and a right surface of the right lower body 32' may be disposed to be inclined to the left from an end of a right surface of the right upper body 30, or may be disposed to be vertical thereto.

Figure 6:
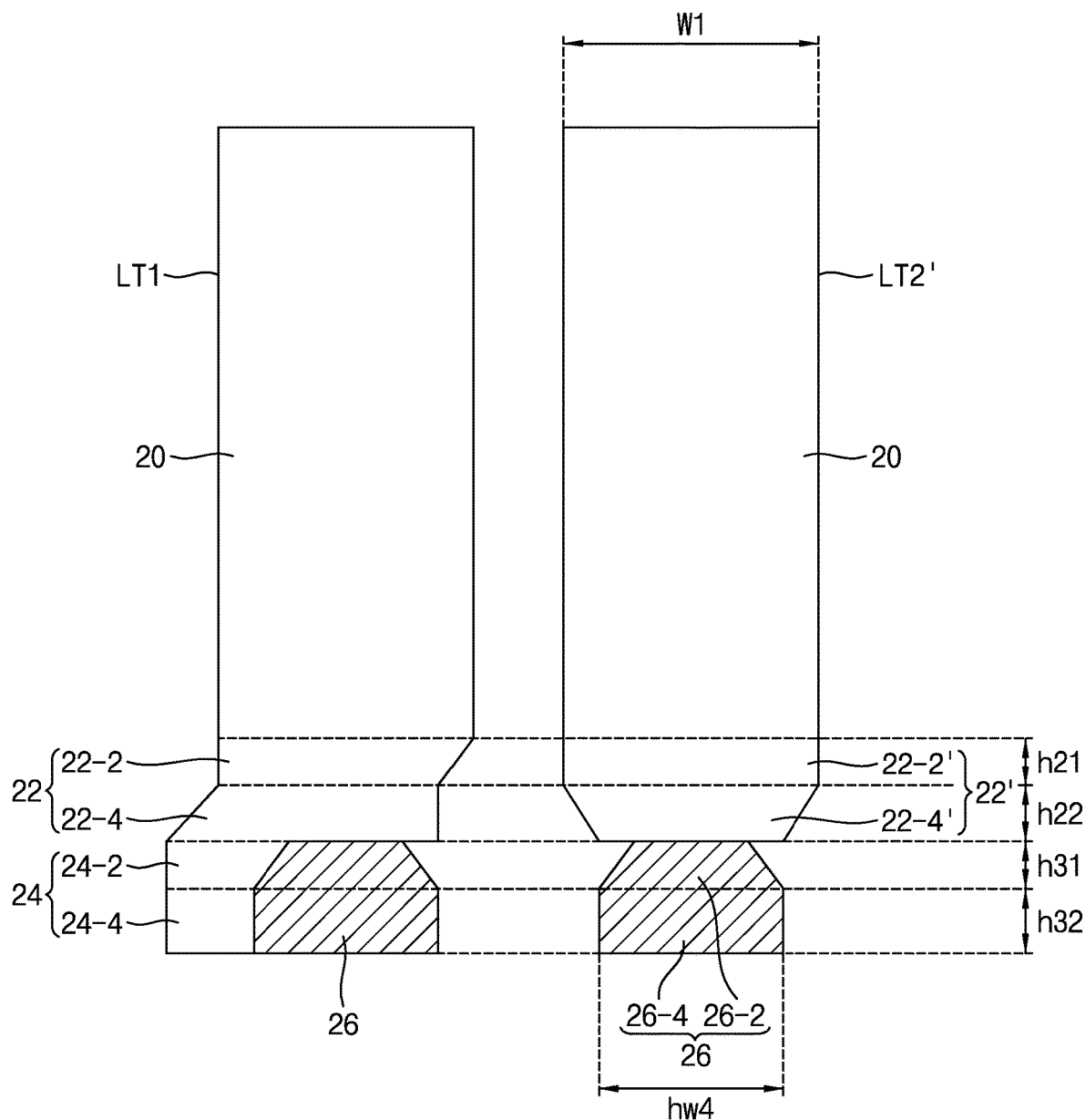
FIG. 6 is a detailed diagram illustrating left terminals according to an example embodiment.

FIG. 6 is a detailed diagram illustrating a plurality of left terminals disposed in a left terminal region 12-1 according to an example embodiment.

The detailed shape and arrangement of the left terminal LT1 disposed in the left terminal region 12-1 illustrated in FIG. 6 may be understood from the description of FIG. 3. Hereinafter, the detailed shape and arrangement of a left terminal LT2' will be described.

Referring to FIG. 6, a left upper body 20 of a left terminal LT2' may have the same shape and arrangement as the left upper body 20 of the left terminal LT2 illustrated in FIG. 3. A left lower body 22' of the left terminal LT2' may include a first left lower body 22-2' and a second left lower body 22-4'. The first left lower body 22-2' may be disposed to have the fourth certain height h21 and the first certain width w1, and the second left lower body 22-4' may be disposed to have the fifth certain height h22, and the first certain width w1 and the fourth maximum certain width hw4. A right surface of the first left lower body 22-2' may be disposed to be vertical from an end of a right surface of the left upper body 20, and a left surface of the first left lower body 22-2' may be disposed to be vertical from an end of a left surface of the left upper body 20. A right surface of the second left lower body 22-4' may be disposed to have the second certain slope s2 down and toward the left from an end of a right surface of the first left lower body 22-2', and a left surface of the second left lower body 22-4' may be disposed to have the second certain slope s2 down and toward the right from an end of a left surface of the first left lower body 22-2'. Additionally, like description given above with reference to FIG. 3, a left conductive inhibition region 26 may be disposed between a bottom surface of the second left lower body 22-4' and an end of the module board 120.

Figure 7:
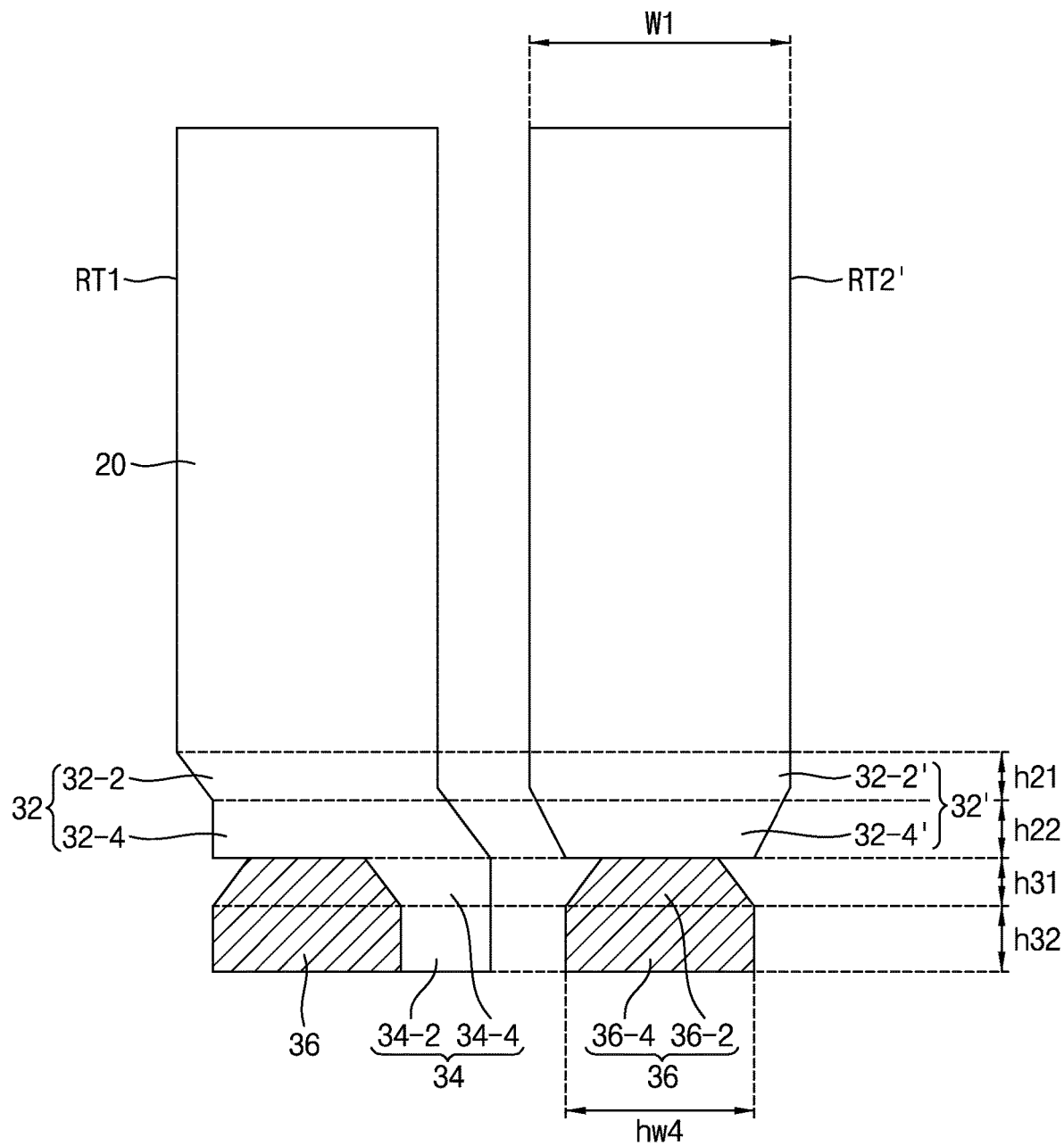
FIG. 7 is a detailed diagram illustrating right terminals according to an example embodiment.

FIG. 7 is a detailed diagram illustrating a plurality of right terminals disposed in a right terminal region 12-2 according to an example embodiment.

The detailed shape and arrangement of the right terminal RT1 disposed in the right terminal region 12-2 illustrated in FIG. 7 may be understood from the description of FIG. 4. Also, the right terminal RT2' may have the same shape as a left terminal LT2', and thus, may be understood from the description of FIG. 6.

Figure 8:
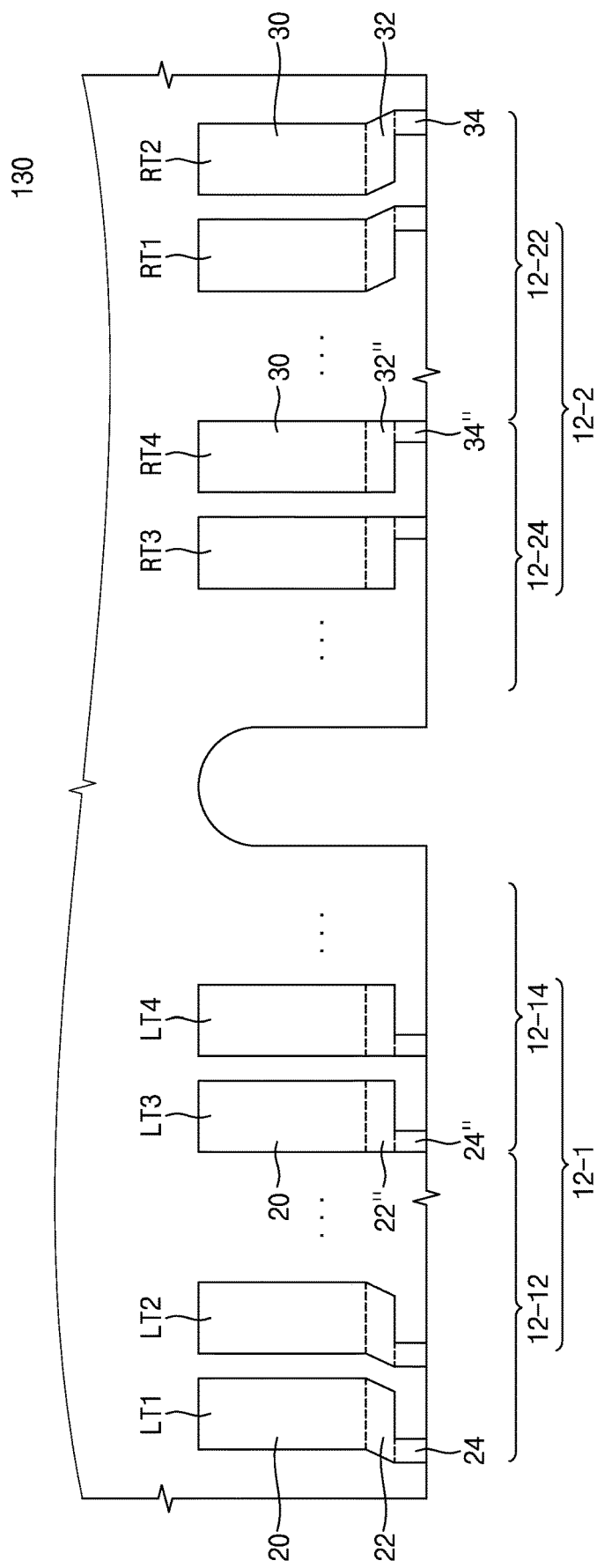
FIG. 8 is a diagram illustrating an arrangement of left terminals disposed in a left terminal region of a module board and right terminals disposed in a right terminal region of the module board, according to an example embodiment.

FIG. 8 is a diagram illustrating the arrangement of left terminals disposed in a left terminal region 12-1 and right terminals disposed in a right terminal region 12-2, according to an example embodiment. The left terminal region 12-1 of a module board 130 may be divided into a first left terminal region 12-12 and a second left terminal region 12-14, and the right terminal region 12-2 of the module board 130 may be divided into a first right terminal region 12-22 and a second right terminal region 12-24. The first left terminal region 12-12 may be disposed at a left portion of the second left terminal region 12-14, and the first right terminal region 12-22 may be disposed at a right portion of the second right terminal region 12-24. FIG. 8 illustrates two representative left terminals LT1 and LT2 disposed in the first left terminal region 12-12, two representative left terminals LT3 and LT4 disposed in the second left terminal region 12-14, two representative right terminals RT1 and RT2 disposed in the first right terminal region 12-22, and two representative right terminals RT3 and RT4 disposed in the second right terminal region 12-24.

Referring to FIG. 8, the left terminals LT1 and LT2 of the module board 110 of FIG. 2 may be disposed in the first left terminal region 12-12 of the module board 130, and the left terminals LT3 and LT4 may be disposed in the second left terminal region 12-14. The right terminals RT1 and RT2 of the module board 110 of FIG. 2 may be disposed in the first right terminal region 12-22 of the module board 130, and the right terminals RT3 and RT4 may be disposed in the second right terminal region 12-24. The left terminals LT1 and LT2 and the right terminals RT1 and RT2 of FIG. 8 may be understood from the description of FIG. 2. Hereinafter, the detailed shapes and arrangement of the left terminals LT3 and LT4 and the right terminals RT3 and RT4 will be described.

Referring to FIG. 8, each of the left terminals LT3 and LT4 may include a left upper body 20, a left lower body 22", and a left lower bar 24". The left upper body 20 of each of the left terminals LT3 and LT4 may be disposed to have the same shape and size as the left upper body 20 of the left terminal LT1. A right surface of the left lower body 22" of each of the left terminals LT3 and LT4 may be disposed to be vertical from an end of a right surface of the left upper body 20, and a left surface of the left lower body 22" may be disposed to be vertical from an end of a left surface of the left upper body 20. A left surface of the left lower bar 24" of each of the left terminals LT3 and LT4 may be disposed to be vertical from an end of a left surface of the left lower body 22", and a right surface of the left lower bar 24" may be disposed to be vertical at a position which is horizontally offset from the left surface by a width which is less than that of the left lower body 22".

Referring to FIG. 8, each of the right terminals RT3 and RT4 may include a right upper body 30, a right lower body 32", and a right lower bar 34". The right upper body 30 of each of the right terminals RT3 and RT4 may be disposed to have the same shape and size as the right upper body 30 of the right terminal RT1. A right surface of the right lower body 32" of each of the right terminals RT3 and RT4 may be disposed to be vertical from an end of a right surface of the right upper body 30, and a left surface of the right lower body 32" may be disposed to be vertical from an end of a left surface of the right upper body 30. A right surface of the right lower bar 34" of each of the right terminals RT3 and RT4 may be disposed to be vertical from an end of a right surface of the right lower body 32", and a left surface of the right lower bar 34" may be disposed to be vertical at a position which is horizontally offset from the right surface by a width which is less than that of the left upper body 30.

For example, the left terminals LT3 and LT4 may be disposed in the second right terminal region 12-24, and the right terminals RT3 and RT4 may be disposed in the second left terminal region 12-14. As another example, the left terminals LT3 and LT4 may be disposed in both the second left terminal region 12-14 and the second right terminal region 12-24, or the right terminals RT3 and RT4 may be disposed in both the second left terminal region 12-14 and the second right terminal region 12-24. As another example, the left terminals LT3 and LT4 and the right terminals RT3 and RT4 may be mixed and disposed in each of the second left terminal region 12-14 and the second right terminal region 12-24.

Figure 9:
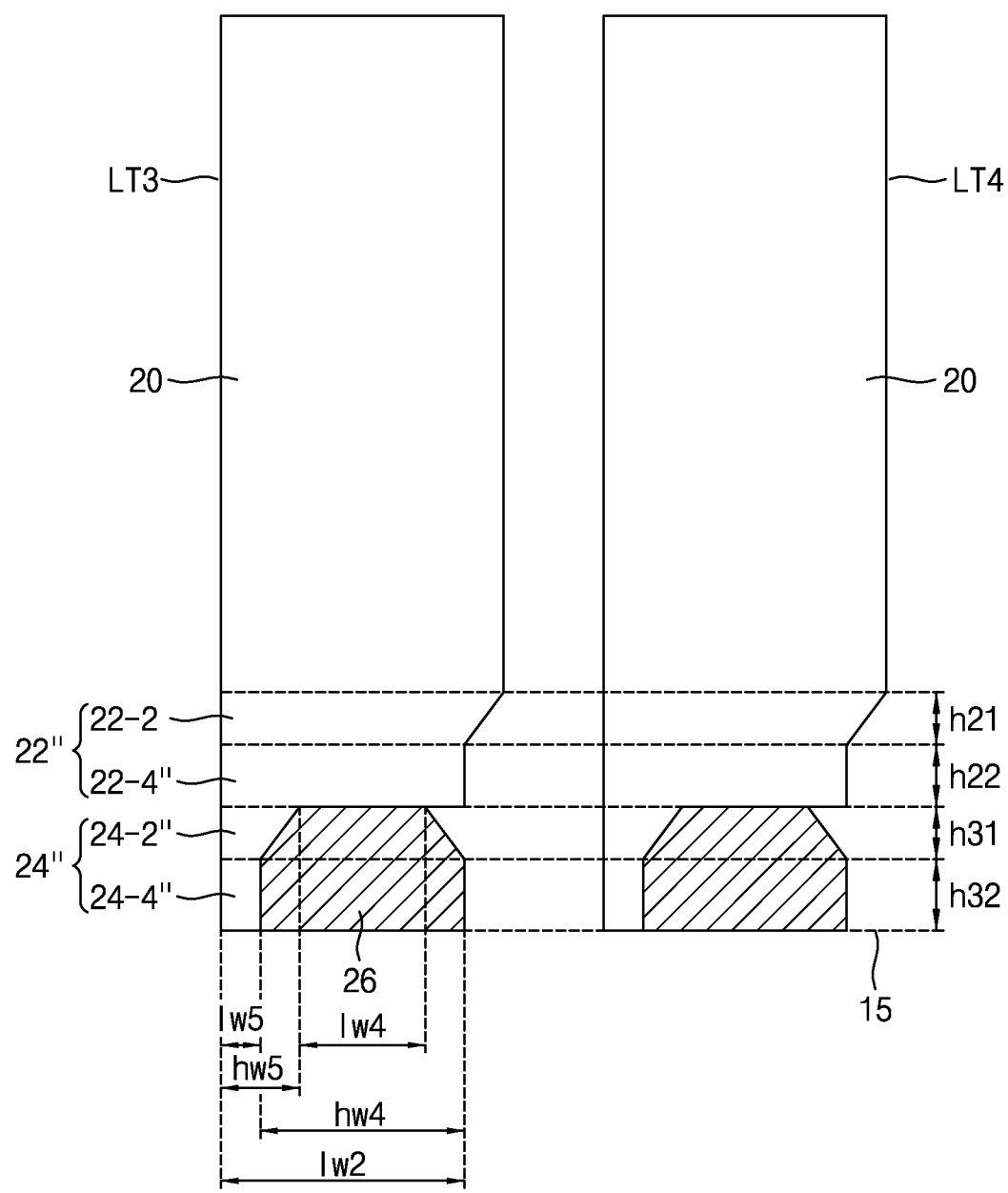
FIG. 9 is a detailed diagram illustrating left terminals according to an example embodiment.

FIG. 9 is a detailed diagram illustrating a plurality of left terminals disposed in a left terminal region 12-14 according to an example embodiment.

The detailed shapes and arrangement of left terminals LT1 and LT2 disposed in the left terminal region 12-14 illustrated in FIG. 9 may be understood from the description of FIG. 3. Hereinafter, the detailed shapes and arrangement of left terminals LT3 and LT4 will be described.

Referring to FIG. 9, each of the left terminals LT3 and LT4 may include a left upper body 20, a left lower body 22", and a left lower bar 24". Referring to FIGS. 1A and 9, the left upper body 20 of each of the left terminals LT3 and LT4 may have the same shape and arrangement as the left upper body 20 of the left terminal LT1 illustrated in FIG. 3. However, example embodiments are not limited thereto, and referring to FIGS. 1B and 9, a height of the left upper body 20 of each of the left terminals LT3 and LT4 may be greater than the first certain height h1. The left lower body 22" of each of the left terminals LT3 and LT4 may include a first left lower body 22-2 and a second left lower body 22-4". The left lower bar 24" of each of the left terminals LT3 and LT4 may include a first left lower bar 24-2" and a second left lower bar 24-4". Right surfaces of the left lower body 22" and the left lower bar 24" of each of the left terminals LT3 and LT4 may be disposed to have the same shape and size as the right surface of the left terminal LT1 described above with reference to FIG. 3, and left surfaces of the left lower body 22" and the left lower bar 24" may be disposed to be vertical from an end of a left surface of the left upper body 20. Therefore, the first left lower body 22-2 may be disposed to have the fourth certain height h21, and the first certain width w1 and the second minimum certain width lw2, and the second left lower body 22-4" may be disposed to have the fifth certain height h22 and the second minimum certain width lw2. The first left lower bar 24-2" may be disposed to have the sixth certain height h31, and a fifth maximum certain width hw5 and a fifth minimum certain width lw5, and the second left lower bar 24-4" may be disposed to have the seventh certain height h32 and the fifth minimum certain width lw5. A left conductive inhibition region 26 disposed to have the same shape and size as the left conductive inhibition region 26 discussed with respect to FIG. 3 may be between an end of the module board 130 and a bottom surface of the second left lower body 22-4" of each of the left terminals LT3 and LT4.

Figure 10:
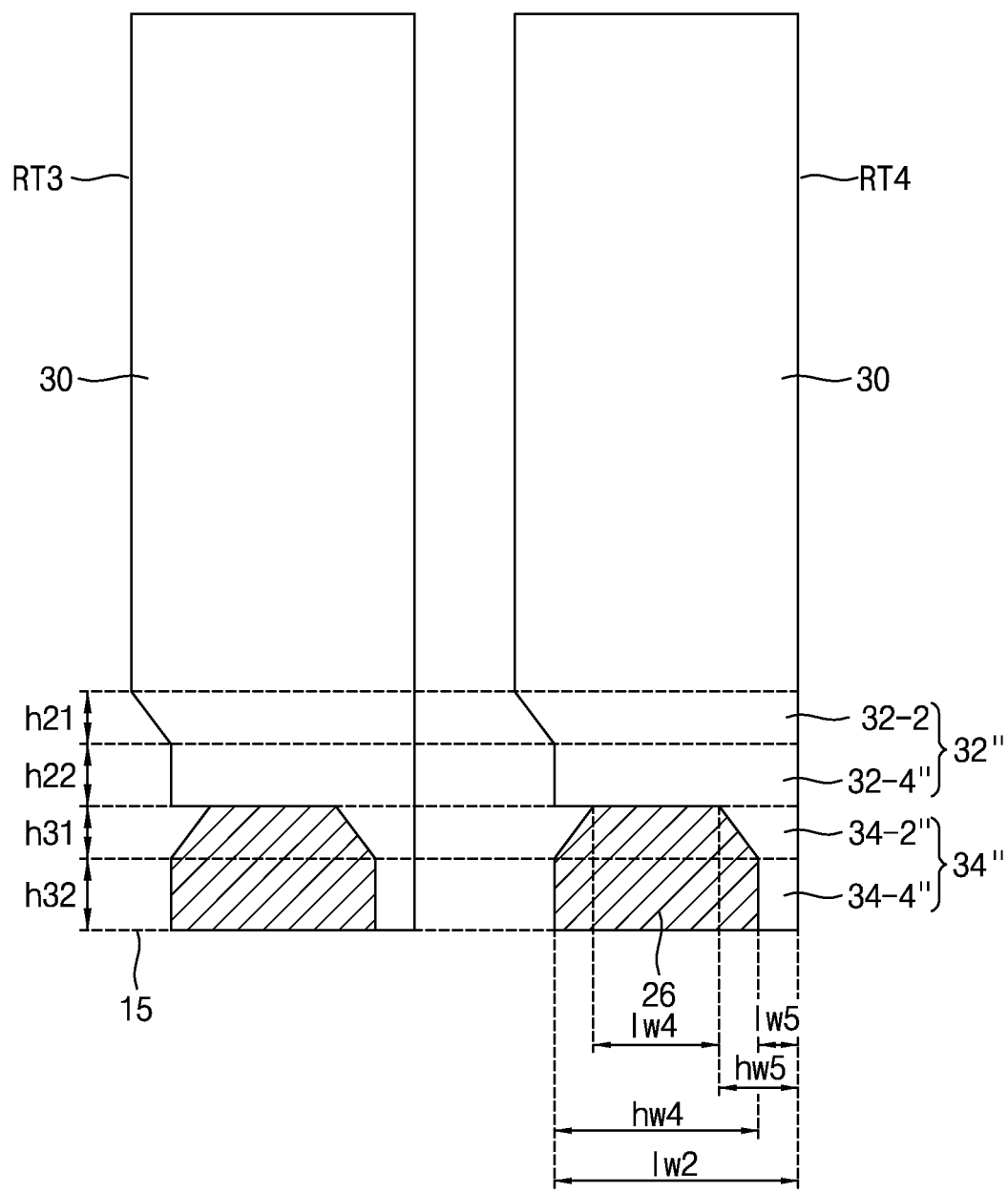
FIG. 10 is a detailed diagram illustrating right terminals according to an example embodiment.

FIG. 10 is a detailed diagram illustrating a plurality of right terminals disposed in a right terminal region 12-24 according to an example embodiment.

The detailed shapes and arrangement of right terminals RT1 and RT2 disposed in the right terminal region 12-24 illustrated in FIG. 10 may be understood from the description of FIG. 4. Hereinafter, the detailed shapes and arrangement of right terminals RT3 and RT4 will be described.

Referring to FIG. 10, each of the right terminals RT3 and RT4 may include a right upper body 30, a right lower body 32", and a right lower bar 34". Referring to FIGS. 1A and 10, the right upper body 30 of each of the right terminals RT3 and RT4 may have the same shape and arrangement as the right upper body 30 of the right terminal RT1 illustrated in FIG. 4. On the other hand, referring to FIGS. 1B and 10, a height of the right upper body 30 of each of the right terminals RT3 and RT4 may be greater than the first certain height h1. The right lower body 32" of each of the right terminals RT3 and RT4 may include a first right lower body 32-2 and a second right lower body 32-4". The right lower bar 34" of each of the right terminals RT3 and RT4 may include a first right lower bar 34-2" and a second right lower bar 34-4". Left surfaces of the right lower body 32" and the right lower bar 34" of each of the right terminals RT3 and RT4 may be disposed to have the same shape and size as the left surface of the right terminal RT1 described above with reference to FIG. 4, and right surfaces of the right lower body 32" and the right lower bar 34" may be disposed to be vertical from an end of a right surface of the right upper body 30. Therefore, the first right lower body 32-2 and the second right lower body 32-4" may respectively have the same height and width as the first left lower body 22-2 and the second left lower body 22-4" described above with reference to FIG. 9. A right conductive inhibition region 36 disposed to have the same shape and size as the right conductive inhibition region 36 of FIG. 4 may be between an end of the module board 130 and a bottom surface of the second right lower body 32-4" of each of the right terminals RT3 and RT4.

Figure 11:
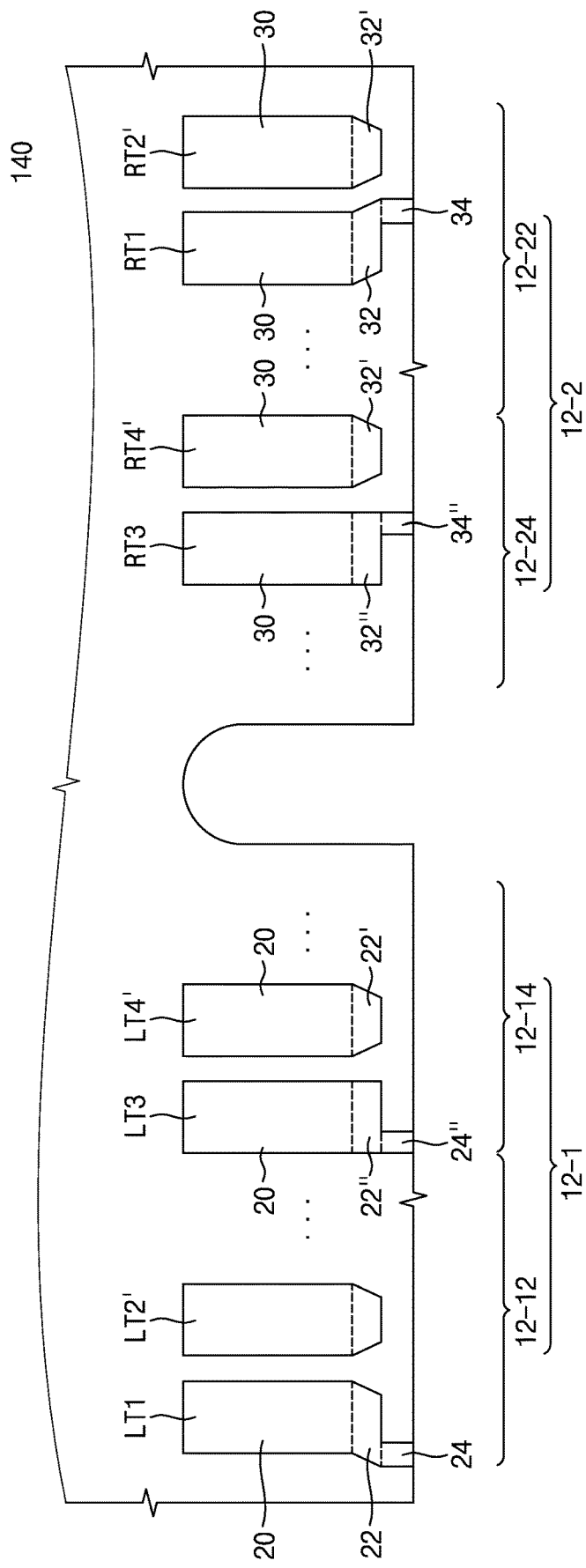
FIG. 11 is a diagram illustrating left terminals disposed in a left terminal region of a module board and right terminals disposed in a right terminal region of the module board, according to an example embodiment.

FIG. 11 is a diagram illustrating left terminals disposed in a left terminal region 12-1 and right terminals disposed in a right terminal region 12-2, according to an example embodiment. The left terminal region 12-1 of a module board 140 may be divided into a first left terminal region 12-12 and a second left terminal region 12-14, and the right terminal region 12-2 of the module board 140 may be divided into a first right terminal region 12-22 and a second right terminal region 12-24. The first left terminal region 12-12 may be disposed at a left portion of the second left terminal region 12-14, and the first right terminal region 12-22 may be disposed at a right portion of the second right terminal region 12-24. FIG. 11 illustrates two representative left terminals LT1 and LT2' disposed in the first left terminal region 12-12, two representative left terminals LT3 and LT4' disposed in the second left terminal region 12-14, two representative left terminals RT1 and RT2' disposed in the first right terminal region 12-22, and two representative left terminals RT3 and RT4' disposed in the second right terminal region 12-24.

The detailed shapes and arrangement of the left terminals LT1, LT2', and LT4' disposed in the left terminal region 12-1 illustrated in FIG. 11 may be understood from the description of FIG. 6, and the detailed shape and arrangement of the left terminal LT3 may be understood from the description of FIG. 9. Likewise, the detailed shapes and arrangement of the right terminals RT1, RT2', and RT4' disposed in the right terminal region 12-2 may be understood from the description of FIG. 7, and the detailed shape and arrangement of the right terminal RT3 may be understood from the description of FIG. 10.

According to an example embodiment, the left terminal LT3 may be disposed in the second right terminal region 12-24, and the right terminal RT3 may be disposed in the second left terminal region 12-14. As another example, the left terminal LT3 may be disposed in both the second left terminal region 12-14 and the second right terminal region 12-24, or the right terminal RT3 may be disposed in both the second left terminal region 12-14 and the second right terminal region 12-24. According to another example embodiment, the left terminal LT3 and the right terminal RT3 may be mixed and disposed in each of the second left terminal region 12-14 and the second right terminal region 12-24.

Figure 12A:
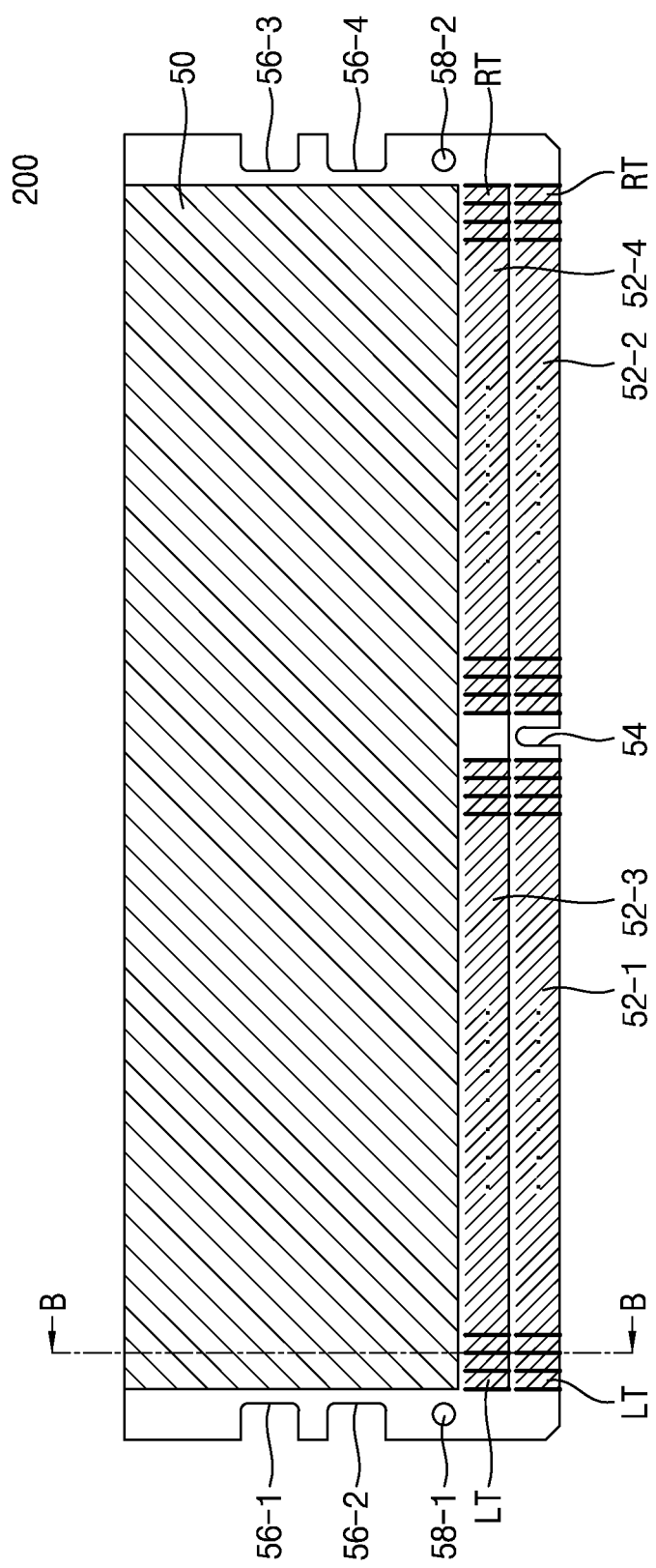
FIGS. 12A, 12B and 12C are diagrams illustrating module boards according to example embodiments.

FIG. 12A is a diagram illustrating a module board 200 according to an example embodiment. The module board 200 may include an element region 50 where a plurality of elements are disposed. The plurality of elements may be disposed on one surface (for example, a top surface) of the module board 200. The module board 200 may include a left terminal region 52-3 which is disposed at a left portion of an edge region of one side of the one surface, a plurality of left terminals LT (for example, left taps) which are disposed in the left terminal region 52-3, a right terminal region 52-4 which is disposed at a right portion of the edge region of the one side of the one surface, and a plurality of right terminals RT (for example, right taps) which are disposed in the right terminal region 52-4. Additionally, the module board 200 may include a left terminal region 52-1 disposed at a left portion of a lower surface of the one surface, a plurality of left terminals LT disposed in the left terminal region 52-1, a right terminal region 52-2 disposed at a right portion of the lower surface of the one surface, and a plurality of right terminals RT disposed in the right terminal region 52-2. Also, the module board 200 may include a plurality of notches 54 and 56-1 to 56-4 and a plurality of holes 58-1 and 58-2, which are reference points corresponding to positions of the module board 200. The notch 54 may be disposed between the left terminal region 52-1 and the right terminal region 52-2, which are disposed at the edge of the lower surface of the one surface of the module board 200 and may differentiate a left portion of the module board 200 from a right portion of the module board 200. According to other example embodiments, an element region, a left terminal region, and a right terminal region may be disposed on another surface (for example, the bottom surface) of the module board 200 at positions of the other surface corresponding to the element region 50, the left terminal regions 52-1 and 52-3, and the right terminal regions 52-2 and 52-4 which are disposed on the one surface of the module board 100.

Figure 12B:
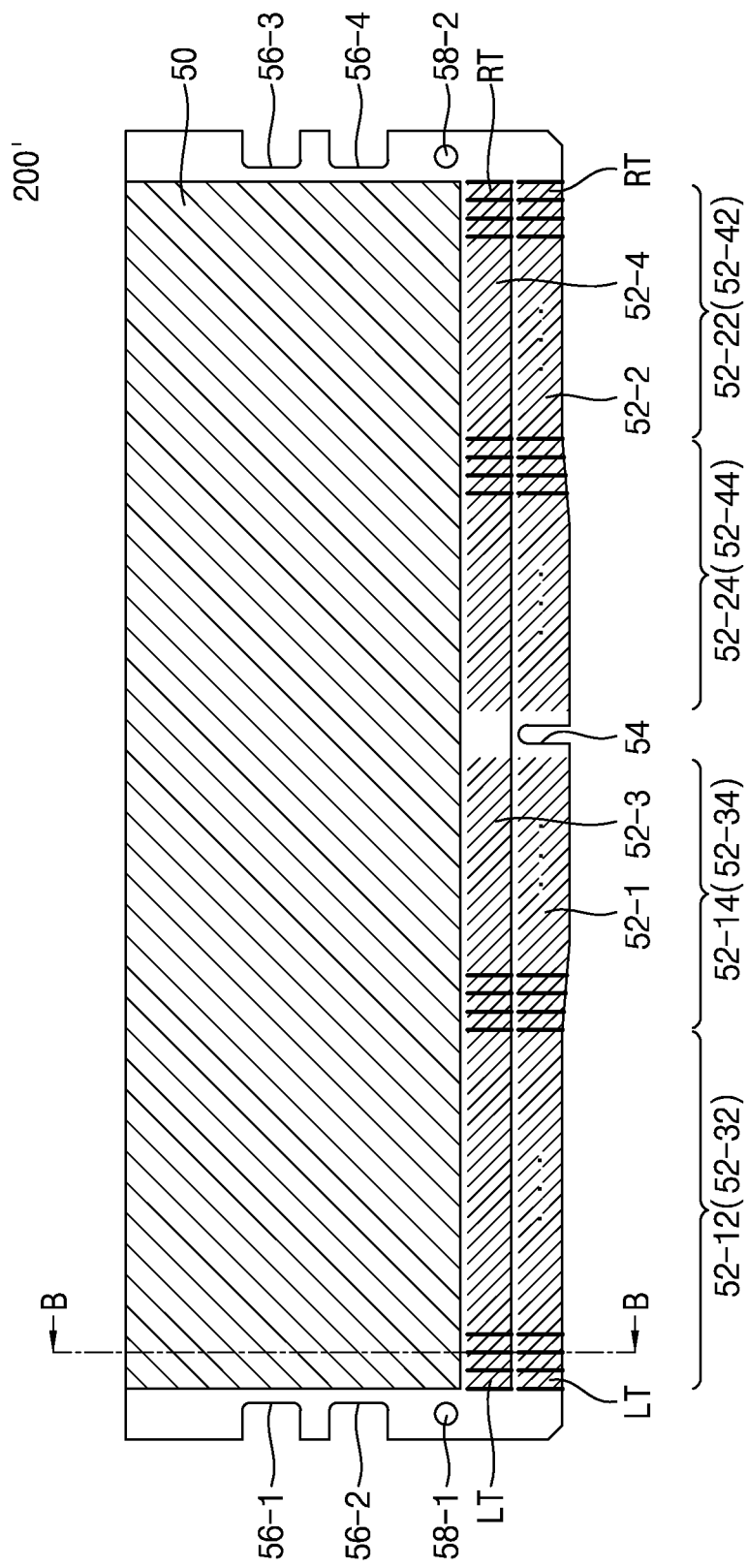

FIG. 12B is a diagram illustrating a module board 200' according to an example embodiment. A left terminal region 52-1 of the module board 200' illustrated in FIG. 12B may be divided into a first left terminal region 52-12 and a second left terminal region 52-14, a left terminal region 52-3 may be divided into a third left terminal region 52-32 and a fourth left terminal region 52-34, a right terminal region 52-2 may be divided into a first right terminal region 52-22 and a second right terminal region 52-24, and a right terminal region 52-4 may be divided into a third right terminal region 52-42 and a fourth right terminal region 52-44. A height of each of the plurality of left terminals LT disposed in the second left terminal region 52-14 of the module board 200' illustrated in FIG. 12B may be greater than that of each of the plurality of left terminals LT disposed in the first left terminal region 52-12. Likewise, a height of each of the plurality of right terminals RT disposed in the second right terminal region 52-24 may be greater than that of each of the plurality of right terminals RT disposed in the first right terminal region 52-22. As illustrated in FIG. 12B, upper surfaces of the plurality of left terminals LT disposed in the left terminal region 52-1 and upper surfaces of the plurality of right terminals RT disposed in the right terminal region 52-2 may be aligned.

Figure 12C:
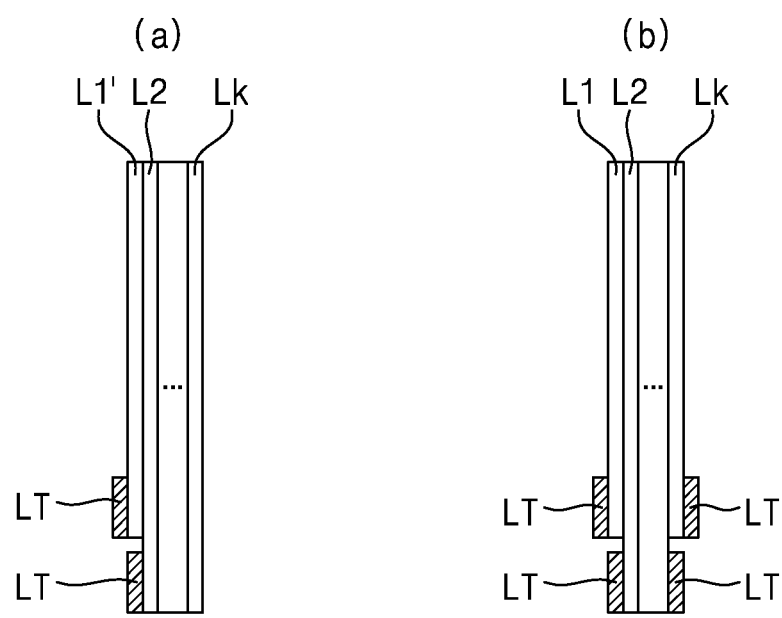

FIG. 12C illustrates diagrams of cross-sectional views of module boards according to example embodiments and illustrate a cross-sectional view taken along line B-B of FIG. 12A and FIG. 12B. Portion (a) of FIG. 12C is a cross-sectional view of a case where a plurality of left and right terminals are disposed on one surface of the module board 200 or the module board 200', and portion (b) of FIG. 12C is a cross-sectional view of a case where a plurality of left and right terminals are disposed on both surfaces of the module board 200 or the module board 200'.

Referring to FIGS. 12A, 12B and 12C, the module board 200 or the module board 200' may be a printed circuit board configured with a plurality of layers (for example, k number of layers L1 to Lk) which are stacked. The descriptions of FIGS. 1A, 1B and 1C may be applied to the module board 200 or the module board 200'.

Figure 13:
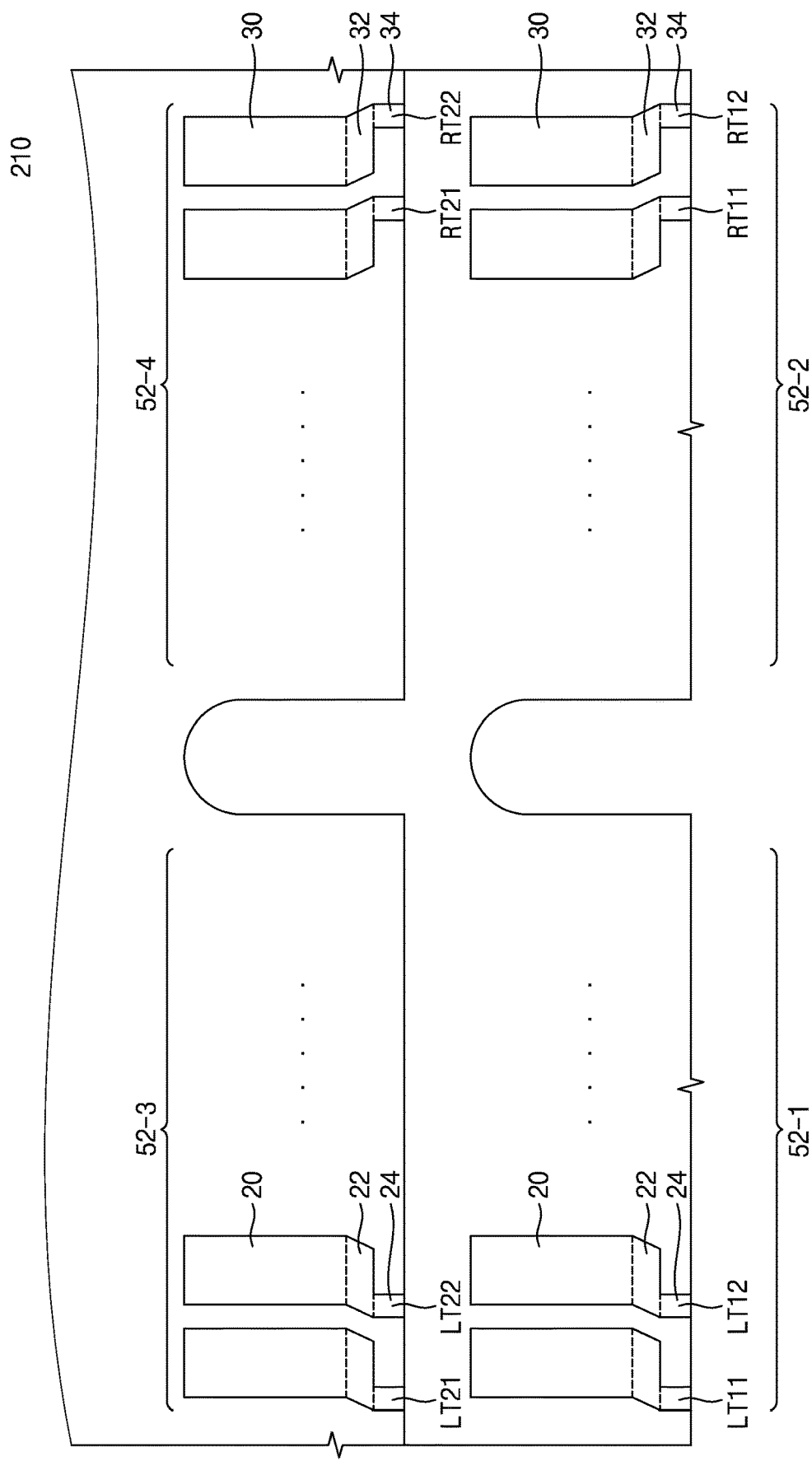
FIG. 13 is a diagram illustrating an arrangement of a plurality of left terminals disposed in a plurality of left terminal regions of a module board and a plurality of right terminals disposed in a plurality of right terminal region of the module board, according to an example embodiment.

FIG. 13 is a diagram illustrating the arrangement of a plurality of left terminals disposed in a plurality of left terminal regions 52-1 and 52-3 and a plurality of right terminals disposed in a plurality of right terminal region 52-2 and 52-4, according to an example embodiment. As shown, two representative left terminals LT11 and LT12 may be disposed at a leftmost portion of the left terminal region 52-1 of a module board 210, two representative left terminals LT21 and LT22 may be disposed at a leftmost portion of the left terminal region 52-3, two representative right terminals RT11 and RT12 may be disposed at a rightmost portion of the right terminal region 52-2, and two representative right terminals RT21 and RT22 may be disposed at a rightmost portion of the right terminal region 52-4.

Referring to FIGS. 12A, 12B, and 13, the shapes and arrangement of a plurality of left terminals including the left terminals LT11 and LT12 disposed in the left terminal region 52-1 and a plurality of right terminals including the right terminals RT11 and RT12 disposed in the right terminal region 52-2 may be understood with reference to the description of FIG. 2. The shapes and arrangement of the left terminals LT11 and LT12 disposed in the left terminal region 52-1 and the right terminals RT11 and RT12 disposed in the right terminal region 52-2 may be the same as those of the left terminals LT1 and LT2 and the right terminals RT1 and RT2. The shapes and arrangement of the left terminals LT21 and LT22 disposed in the left terminal region 52-3 and the right terminals RT21 and RT22 disposed in the right terminal region 52-4 may be the same as those of the left terminals LT11 and LT12 and the right terminals RT11 and RT12.

According to other example embodiments, shapes and arrangement of a plurality of left terminals LT disposed in the left terminal region 52-1 may have the same as those described above with reference to FIGS. 5 and 6 or FIGS. 8 and 9, and the shapes and arrangement of a plurality of right terminals RT disposed in the right terminal region 52-2 may have the same as those described above with reference to FIGS. 5 and 7 or FIGS. 8 and 10. Likewise, the shapes and arrangement of a plurality of left terminals LT disposed in the left terminal region 52-3 may have the same as those described above with reference to FIGS. 5 and 6 or FIGS. 8 and 9, and the shapes and arrangement of a plurality of right terminals RT disposed in the right terminal region 52-4 may have the same as those described above with reference to FIGS. 5 and 7 or FIGS. 8 and 10. However, the shape and arrangement of the plurality of left terminals LT disposed in the left terminal region 52-1 may not be the same as those of the plurality of left terminals LT disposed in the left terminal region 52-3. Likewise, the shape and arrangement of the plurality of right terminals RT disposed in the right terminal region 52-2 may not be the same as those of the plurality of right terminals RT disposed in the right terminal region 52-4.

Figure 14:
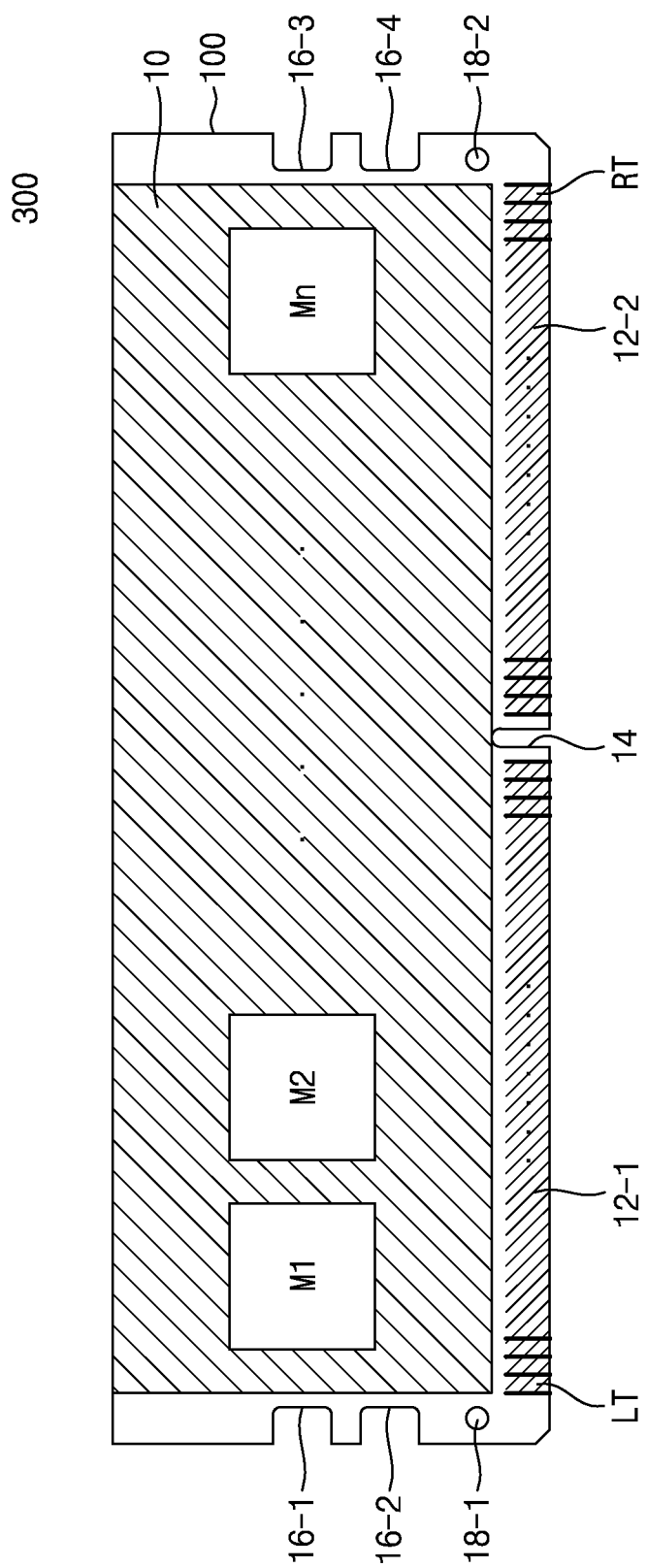
FIGS. 14 and 15 are diagrams illustrating memory modules according to example embodiments.

FIG. 14 is a diagram illustrating a memory module 300 according to an example embodiment. The memory module 300 may include n (where n is an integer of 2 or more) semiconductor memory devices M1 to Mn which are mounted in the element region 10 of the module board 100 illustrated in FIG. 1A. According to other example embodiments, the n semiconductor memory devices M1 to Mn may be mounted in the element region 10 of the module board 100' illustrated in FIG. 1B. A module board of the memory module 300 may be a module board described above with reference to FIGS. 1A to 11.

Figure 15:
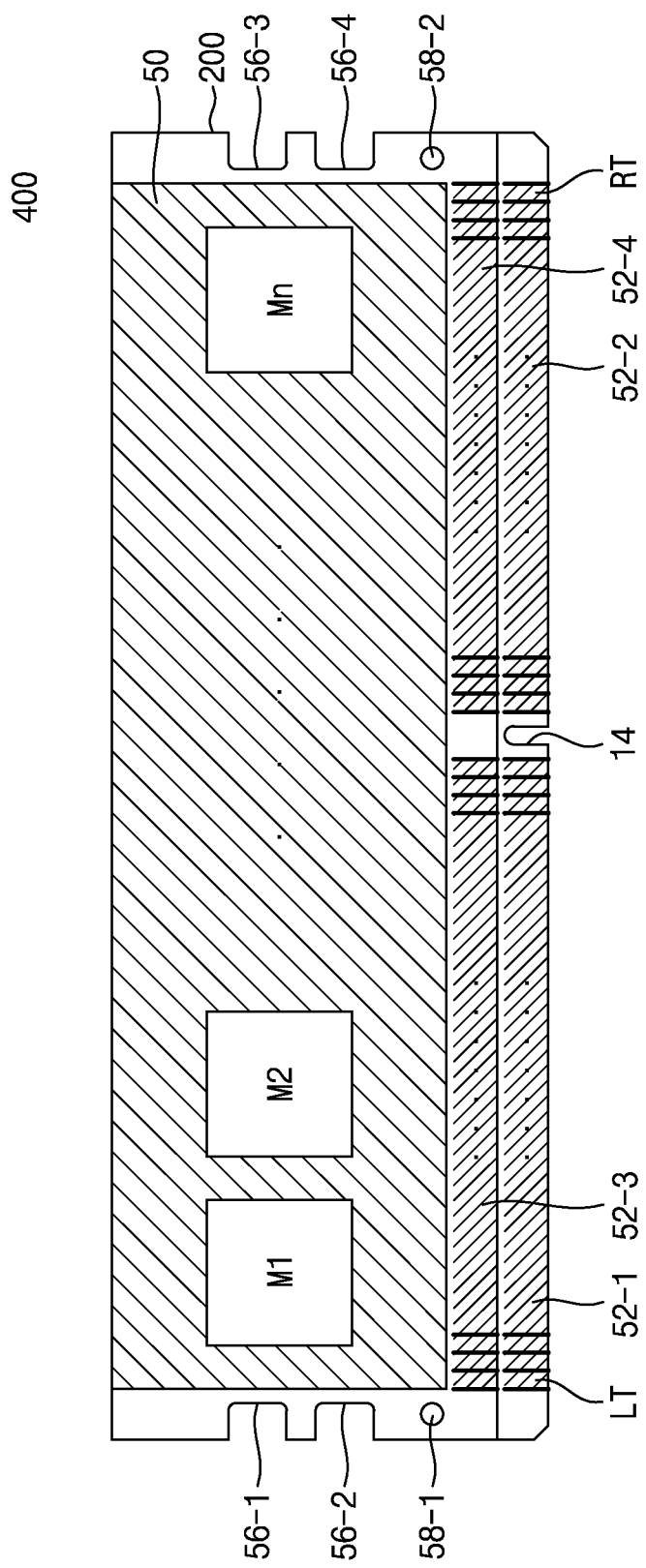

FIG. 15 is a diagram illustrating a memory module 400 according to an example embodiment. The memory module 400 may include n semiconductor memory devices M1 to Mn which are mounted in the element region 50 of the module board 200 illustrated in FIG. 12A. According to other example embodiments, the n semiconductor memory devices M1 to Mn may be mounted in the element region 50 of the module board 200' illustrated in FIG. 12B. A module board of the memory module 400 may be the module board described above with reference to FIGS. 12A to 13.

In example embodiments described above, corners of terminals have been described as having angular shapes, but example embodiments are not limited thereto. For example, corners of terminals may have a curved shape. Also, surfaces of the terminals have been described as a straight line. However, example embodiments are not limited thereto and surfaces of the terminals may have a curved shape.

According to example embodiments, a left surface of a left lower bar of each of left terminals of a module board may be disposed farther to the left than a left surface of a left upper body thereof, and a right surface of a right lower bar of each of right terminals of the module board may be disposed farther to the right than a right surface of a right upper body thereof, thereby reducing an error, where a lower bar is broken, as well as electrical defects of terminals occurring when the module board is non-uniformly inserted into a left portion or a right portion. Accordingly, the product reliability of a memory module including the module board may be improved.

While example embodiments have been described with reference to the accompanying drawings, it will be apparent to those skilled in the art that modifications and variations could be made without departing from the scope of the present disclosure.

What is claimed is:

1. A module board comprising:
a plurality of first left terminals provided in a left terminal region located at a left portion of an edge region provided on a first surface of the module board; and
a plurality of first right terminals provided in a right terminal region located at a right portion of the edge region,
wherein each of the plurality of first left terminals comprises a left upper body, a left lower body, and a left lower bar which are connected to one another and sequentially provided between a left upper portion of the left terminal region and a left lower portion of the left terminal region,
wherein each of the plurality of first right terminals comprises a right upper body, a right lower body, and a right lower bar which are connected to one another and sequentially provided between a right upper portion of the right terminal region and a right lower portion of the right terminal region,
wherein a first width of each of the left upper body and the right upper body is greater than a second width of each of the left lower bar and the right lower bar,
wherein the left upper body of each of the plurality of first left terminals and the right upper body of each of the plurality of first right terminals has a first height and the first width,
wherein the left lower body of each of the plurality of first left terminals and the right lower body of each of the plurality of first right terminals has a second height, a third minimum width and a third maximum width, a portion of a left surface and a portion of a right surface of the left lower body of each of the plurality of first left terminals extend diagonally toward a left direction, and a portion of a left surface and a portion of a right surface of each of the right lower body of each of the plurality of first right terminals extend diagonally toward a right direction,
wherein the left lower bar of each of the plurality of first left terminals and the right lower bar of each of the plurality of first right terminals has a third height, a second minimum width and a second maximum width, a left surface of the left lower bar of each of the plurality of first left terminals and a right surface of the right lower bar of each of the plurality of first right terminals are substantially perpendicular to a lower edge of the first surface, a portion of a right surface of the left lower bar of each of the plurality of first left terminals extends diagonally toward the left direction, and a portion of a left surface of the right lower bar of each of the plurality of first right terminals extends diagonally toward the right direction, and
wherein the first height is greater than a sum of the second height and the third height.

2. The module board of claim 1, wherein the left terminal region comprises a first left terminal region and a second left terminal region,
wherein the right terminal region comprises a first right terminal region and a second right terminal region,
wherein the second left terminal region and the second right terminal region are provided between the first left terminal region and the first right terminal region, and
wherein the plurality of first left terminals are disposed in the first left terminal region, and the plurality of first right terminals are disposed in the first right terminal region.

3. The module board of claim 1, wherein the left lower body of each of the plurality of first left terminals comprises a first left lower body and a second left lower body,
wherein a left surface of the first left lower body extends vertically from an end of the left surface of the left upper body, a right surface of the first left lower body extends diagonally toward the left direction from an end of a right surface of the left upper body, a left surface of the second left lower body extends diagonally toward the left direction from an end of the left surface of the first left lower body, and a right surface of the second left lower body extends vertically from an end of the right surface of the first left lower body,
wherein the right lower body of each of the plurality of first right terminals comprises a first right lower body and a second right lower body, and
wherein a right surface of the first right lower body extends vertically from an end of the right surface of the right upper body, a left surface of the first right lower body extends diagonally toward the right direction from an end of a left surface of the right upper body, a right surface of the second right lower body extends diagonally toward the right direction from an end of a right surface of the first right lower body, and a left surface of the second right lower body is extends vertically from an end of the left surface of the first right lower body.

4. The module board of claim 3, wherein the left lower bar of each of the plurality of first left terminals comprises a first left lower bar and a second left lower bar,
   wherein a left surface of the first left lower bar extends vertically from an end of the left surface of the second left lower body, a right surface of the first left lower bar is offset from an end of the right surface of the second left lower body by a first distance and extends diagonally toward the left direction, a left surface of the second left lower bar extends vertically from an end of the left surface of the first left lower bar, and a right surface of the second left lower bar extends vertically from an end of the right surface of the first left lower bar,
   wherein the right lower bar of each of the plurality of first right terminals comprises a first right lower bar and a second right lower bar, and
   wherein a right surface of the first right lower bar extends vertically from an end of the right surface of the second right lower body, a left surface of the first right lower bar is offset from an end of the left surface of the second right lower body by the first distance and extends diagonally toward the right direction, a right surface of the second right lower bar extends vertically from an end of the right surface of the first right lower bar, and a left surface of the second right lower bar extends vertically from an end of the left surface of the first right lower bar.

5. The module board of claim 2, wherein a left insulation region having the third height, a fourth minimum width and a fourth maximum width is provided between a bottom surface of the left lower bar of each of the plurality of first left terminals and a bottom surface of the left terminal region, and a left surface of the left insulation region is provided adjacent to the right surface of the left lower bar,
   wherein a right insulation region having the third height, and the fourth minimum width and the fourth maximum width is provided between a bottom surface of the right lower bar of each of the plurality of first right terminals and a bottom surface of the right terminal region, and a right surface of the right insulation region is provided adjacent to the left surface of the right lower bar, and
   wherein the fourth maximum width is less than the first width and greater than the second width.

6. The module board of claim 5, further comprising:
   a plurality of second left terminals provided in the left terminal region; and
   a plurality of second right terminals provided in the right terminal region,
   wherein each of the plurality of second left terminals comprises a left upper body and a left lower body, and the left lower body comprises a first left lower body and a second left lower body,
   wherein the left upper body of each of the plurality of second left terminals has the first height and the first width, a left surface of the first left lower body extends diagonally toward the right direction from an end of a left surface of the left upper body, a right surface of the first left lower body extends diagonally toward the left direction from an end of a right surface of the left upper body, a left surface of the second left lower body is vertically aligned with an end of the left surface of the first left lower body, and a right surface of the second left lower body is vertically aligned with an end of the right surface of the first left lower body,
   wherein each of the plurality of second right terminals comprises a right upper body and a right lower body, and the right lower body comprises a first right lower body and a second right lower body, and
   wherein the right upper body of each of the plurality of second right terminals has the first height and the first width, a left surface of the first right lower body extends diagonally toward the right direction from an end of a left surface of the right upper body, a right surface of the first right lower body extends diagonally toward the left direction from an end of a right surface of the right upper body, a left surface of the second right lower body is vertically aligned with an end of the left surface of the first right lower body, and a right surface of the second right lower body is vertically aligned with an end of the right surface of the first right lower body.

7. The module board of claim 1, wherein the left terminal region comprises a first left terminal region and a second left terminal region,
   wherein the right terminal region comprises a first right terminal region and a second right terminal region,
   wherein the second left terminal region and the second right terminal region are provided between the first left terminal region and the first right terminal region, and
   wherein the plurality of first left terminals and the plurality of second left terminals are provided in the first left terminal region, and the plurality of first right terminals and the plurality of second right terminals are provided in the first right terminal region.

8. The module board of claim 1, further comprising:
   a plurality of second left terminals provided in the left terminal region; and
   a plurality of second right terminals provided in the right terminal region,
   wherein each of the plurality of second left terminals comprises a left upper body, a left lower body and a left lower bar, the left lower body comprises a first left lower body and a second left lower body, and the left lower bar comprises a first left lower bar and a second left lower bar,
   wherein the left upper body of each of the plurality of second left terminals has the first height and the first width, a left surface of the first left lower body extends vertically from an end of a left surface of the left upper body, a right surface of the first left lower body extends diagonally toward the left direction from an end of a right surface of the left upper body, a left surface of the second left lower body extends vertically from an end of the left surface of the first left lower body, a right surface of the second left lower body extends vertically from an end of the right surface of the first left lower body, a left surface of the first left lower bar extends vertically from an end of the left surface of the second left lower body, a right surface of the first left lower bar is offset from an end of the right surface of the second left lower body and extends diagonally toward the left direction, a left surface of the second left lower bar extends vertically from an end of the left surface of the first left lower bar, and a right surface of the second left lower bar extends vertically from an end of the right surface of the first left lower bar, wherein each of the plurality of second right terminals comprises a right upper body, a right lower body and a right lower bar, the right lower body comprises a first right lower body and a second right lower body, and the right lower bar comprises a first right lower bar and a second right lower bar, and wherein the right upper body of each of the plurality of second right terminals has the first height and the first width, a right surface of the first right lower body extends vertically from an end of a right surface of the right upper body, a left surface of the first right lower body extends diagonally toward the right direction from an end of a left surface of the right upper body, a right surface of the second right lower body extends vertically from an end of the right surface of the first right lower body, a left surface of the second right lower body extends vertically from an end of the left surface of the first right lower body, a right surface of the right lower bar extends vertically from an end of the right surface of the second right lower body, a right surface of the first right lower bar extends vertically from an end of the right surface of the second right lower body, a left surface of the first right lower bar is offset from an end of the left surface of the second right lower body and extends diagonally toward the right direction, a right surface of the second right lower bar extends vertically from an end of a right surface of the first right lower bar, and a left surface of the second right lower bar extends vertically from an end of a left surface of the first right lower bar.

9. The module board of claim 8, wherein the left terminal region comprises a first left terminal region and a second left terminal region, and the right terminal region comprises a first right terminal region and a second right terminal region, wherein the second left terminal region and the second right terminal region are provided between the first left terminal region and the first right terminal region, and wherein the plurality of first left terminals are disposed in the first left terminal region, the plurality of second left terminals are provided in the second left terminal region, the plurality of first right terminals are provided in the first right terminal region, and the plurality of second right terminals are provided in the first right terminal region.

10. A memory module comprising:

a module board having an edge region provided on a first surface of the module board, the module board comprising a plurality of left terminals provided in a left terminal region of the edge region and a plurality of right terminals provided in a right terminal region of the edge region; and a plurality of semiconductor memory devices provided on the first surface of the module board, the plurality of left terminals being configured to transfer left signals and left powers to the plurality of semiconductor memory devices, and the plurality of right terminals being configured to transfer right signals and right powers to the plurality of semiconductor memory devices, wherein each of the plurality of left terminals comprises a left upper body, a left lower body and a left lower bar which are connected to one another and sequentially provided between an upper portion of the left terminal region and a lower portion of the left terminal region, the left upper body has a first height and a first width, the left lower body has a second height, a second minimum width and a second maximum width, a portion of a left surface of the left lower body and a portion of a right surface of the left lower body extend diagonally toward a left direction, the left lower bar has a third height, a third minimum width and a third maximum width, and a right surface of the left lower bar extends diagonally toward the left direction, wherein each of the plurality of right terminals comprises a right upper body, a right lower body and a right lower bar which are connected to one another and sequentially provided between an upper portion of the right terminal region and a lower portion of the right terminal region, the right upper body has the first height and the first width, the right lower body has the second height, the second minimum width and the second maximum width, a left surface and a right surface of the right lower body extends diagonally toward a right direction, the right lower bar has the third height, the third minimum width and the third maximum width, and a left surface of the right lower bar extends diagonally toward the right direction, and wherein the first height is greater than a sum of the second height and the third height, the first width is greater than the second minimum width, and the second minimum width is greater than the third minimum width and the third maximum width.

11. The memory module of claim 10, wherein the left terminal region comprises a first left terminal region and a second left terminal region, wherein the right terminal region comprises a first right terminal region and a second right terminal region, wherein the second left terminal region and the second right terminal region are provided between the first left terminal region and the first right terminal region, and wherein the plurality of left terminals are provided in the first left terminal region, and the plurality of right terminals are provided in the first right terminal region.

12. The memory module of claim 11, wherein the left lower body of each of the plurality of left terminals comprises a first left lower body and a second left lower body, wherein a left surface of the first left lower body extends vertically from an end of the left surface of the left upper body, a right surface of the first left lower body extends diagonally toward the left direction from an end of a right surface of the left upper body, a left surface of the second left lower body extends diagonally from an end of the left surface of the first left lower body, and a right surface of the second left lower body extends vertically from an end of the right surface of the first left lower body, wherein the right lower body of each of the plurality of right terminals comprises a first right lower body and a second right lower body, and wherein a right surface of the first right lower body extends vertically from an end of the right surface of the right upper body, a left surface of the first right lower body extends diagonally toward the right direction from an end of a left surface of the right upper body, a right surface of the second right lower body extends diagonally from an end of a right surface of the first right lower body, and a left surface of the second right lower body extends vertically from an end of the left surface of the first right lower body.

13. The memory module of claim 12, wherein the left lower bar of each of the plurality of left terminals comprises a first left lower bar and a second left lower bar, wherein a left surface of the first left lower bar extends vertically from an end of the left surface of the second left lower body, a right surface of the first left lower bar is offset from the right surface of the second left lower body and extends diagonally toward the left direction, a left surface of the second left lower bar extends vertically from an end of the left surface of the first left lower bar, and a right surface of the second left lower bar extends vertically from an end of the right surface of the first left lower bar, wherein the right lower bar of each of the plurality of right terminals comprises a first right lower bar and a second right lower bar, and wherein a right surface of the first right lower bar extends vertically from an end of the right surface of the second right lower body, a left surface of the first right lower bar is offset from the left surface of the second right lower body and extends diagonally toward the right direction, a right surface of the second right lower bar extends vertically from an end of the right surface of the first right lower bar, and a left surface of the second right lower bar extends vertically from an end of the left surface of the first right lower bar.

14. The memory module of claim 13, wherein a left insulation region having the third height, a fourth minimum width and a fourth maximum width is provided between a bottom surface of the left lower bar of each of the plurality of left terminals and a bottom surface of the left terminal region, and a left surface of the left insulation region is provided adjacent to the right surface of the left lower bar, wherein a right insulation region having the third height, the fourth minimum width, and the fourth maximum width is provided between a bottom surface of the right lower bar of each of the plurality of right terminals and a bottom surface of the right terminal region, and a right surface of the right insulation region is provided adjacent to the left surface of the right lower bar, and wherein the fourth maximum width is less than the first width and greater than the second maximum width.

15. A memory module comprising:

a module board having an edge region provided on a first surface of the module board, the module board comprising a plurality of first left terminals provided in a left terminal region of the edge region, and a plurality of first right terminals provided in a right terminal region of the edge region; and a plurality of semiconductor memory devices provided on the first surface of the module board, the plurality of first left terminals being configured to transfer left signals and left powers to the plurality of semiconductor memory devices, and the plurality of first right terminals being configured to transfer right signals and right powers to the plurality of semiconductor memory devices, wherein each of the plurality of first left terminals comprises a left upper body, a left lower body, and a left lower bar which are connected to one another and sequentially provided between an upper portion of the left terminal region and a lower portion of the left terminal region, a left surface of the left lower bar being horizontally offset from a left surface of the left upper body, wherein each of the plurality of first right terminals comprises a right upper body, a right lower body, and a right lower bar which are connected to one another and sequentially provided between an upper portion of the right terminal region and a lower portion of the right terminal region, a right surface of the right lower bar being horizontally offset from a right surface of the right upper body, and wherein a first width of each of the left upper body and the right upper body is greater than a second width of each of the left lower bar and the right lower bar.

16. The memory module of claim 15, wherein the left upper body of each of the plurality of first left terminals and the right upper body of each of the plurality of first right terminals has a first height and the first width, wherein the left lower body of each of the plurality of first left terminals and the right lower body of each of the plurality of first right terminals has a second height, a third minimum width and a third maximum width, a portion of a left surface and a portion of a right surface of the left lower body of each of the plurality of first left terminals extend diagonally toward a left direction, and a portion of a left surface and a portion of a right surface of each of the right lower body of each of the plurality of first right terminals extend diagonally toward a right direction, wherein each of the left lower bar of each of the plurality of first left terminals and the right lower bar of each of the plurality of first right terminals has a third height, a second minimum width and a second maximum width, a left surface of the left lower bar of each of the plurality of first left terminals and a right surface the right lower bar of each of the plurality of first right terminals extends vertically, a portion of a right surface of the left lower bar of each of the plurality of first left terminals extends diagonally in the left direction, and a portion of a left surface of the right lower bar of each of the plurality of first right terminals extends diagonally toward the right direction, and wherein the first height is greater than a sum of the second height and the third height.

17. The memory module of claim 16, wherein the left terminal region comprises a first left terminal region and a second left terminal region, wherein the right terminal region comprises a first right terminal region and a second right terminal region, wherein the second left terminal region and the second right terminal region are provided between the first left terminal region and the first right terminal region, and wherein the plurality of first left terminals are provided in the first left terminal region, and the plurality of first right terminals are provided in the first right terminal region.

18. The memory module of claim 16, wherein the left lower body of each of the plurality of first left terminals comprises a first left lower body and a second left lower body, wherein a left surface of the first left lower body extends vertically from an end of the left surface of the left upper body, a right surface of the first left lower body extends diagonally toward the left direction from an end of a right surface of the left upper body, a left surface of the second left lower body extends diagonally from an end of the left surface of the first left lower body, and a right surface of the second left lower body extends vertically from an end of the right surface of the first left lower body, wherein the right lower body of each of the plurality of first right terminals comprises a first right lower body and a second right lower body, and wherein a right surface of the first right lower body extends vertically from an end of the right surface of the right upper body, a left surface of the first right lower body extends diagonally toward the right direction from an end of a left surface of the right upper body, a right surface of the second right lower body extends diagonally from an end of a right surface of the first right lower body, and a left surface of the second right lower body extends vertically from an end of the left surface of the first right lower body.

19. The memory module of claim 18, wherein the left lower bar of each of the plurality of first left terminals comprises a first left lower bar and a second left lower bar,
wherein a left surface of the first left lower bar extends vertically from an end of the left surface of the second left lower body, a right surface of the first left lower bar is offset from the right surface of the second left lower body and extends diagonally toward the left direction, a left surface of the second left lower bar extends vertically from an end of the left surface of the first left lower bar, and a right surface of the second left lower bar extends vertically from an end of the right surface of the first left lower bar,
wherein the right lower bar of each of the plurality of first right terminals comprises a first right lower bar and a second right lower bar, and
wherein a right surface of the first right lower bar extends vertically from an end of the right surface of the second right lower body, a left surface of the first right lower bar is offset from the left surface of the second right lower body and extends diagonally toward the right direction, a right surface of the second right lower bar extends vertically from an end of the right surface of the first right lower bar, and a left surface of the second right lower bar extends vertically from an end of the left surface of the first right lower bar.

* * * * *